United States Patent [19]

Swanson et al.

[11] Patent Number: 5,298,939
[45] Date of Patent: Mar. 29, 1994

[54] METHOD AND APPARATUS FOR TRANSFER OF A RETICLE PATTERN ONTO A SUBSTRATE BY SCANNING

[76] Inventors: Paul A. Swanson, 3585 Millet Ct., San Jose, Calif. 95127; John A. Gibson, 655 Oneida Dr., Sunnyvale, Calif. 94087; Jeffrey G. Knirck, 868 Jasmine Dr., Sunnyvale, Calif. 94086

[21] Appl. No.: 788,146
[22] Filed: Nov. 4, 1991
[51] Int. Cl.⁵ ............................................. G03B 27/42
[52] U.S. Cl. .................................. 355/53; 355/71; 355/30
[58] Field of Search ......................... 355/53, 30, 71

[56] References Cited

U.S. PATENT DOCUMENTS

| | | |
|---|---|---|
| 3,748,015 | 7/1973 | Offner . |
| 3,819,265 | 6/1974 | Felman et al. ............... 355/51 |
| 3,936,184 | 2/1976 | Tanaka et al. ............... 355/30 |
| 4,103,989 | 8/1978 | Rosin . |
| 4,171,870 | 10/1979 | Bruning et al. . |
| 4,171,871 | 10/1979 | Dill et al. . |
| 4,293,186 | 10/1981 | Offner . |
| 4,302,079 | 11/1981 | White . |
| 4,391,494 | 7/1983 | Hershel . |
| 4,425,037 | 1/1984 | Hershel et al. . |
| 4,655,584 | 4/1987 | Tanaka et al. ............... 355/53 |
| 4,708,466 | 11/1987 | Isohata et al. ............... 355/53 |
| 4,748,477 | 5/1988 | Isohata et al. ............... 355/53 |
| 4,757,355 | 7/1988 | Iizuka et al. ................ 355/53 |
| 4,758,864 | 7/1988 | Endo et al. ................. 355/53 |
| 4,769,680 | 9/1988 | Resor, III et al. ........... 355/43 |
| 4,864,360 | 9/1989 | Isohata et al. ............... 355/53 |
| 4,894,303 | 1/1990 | Wu .......................... 430/13 |
| 4,924,257 | 5/1990 | Jain ......................... 355/53 |
| 4,958,160 | 9/1990 | Ito et al. ................... 355/53 |
| 5,031,977 | 7/1991 | Gibson . |
| 5,117,254 | 5/1992 | Kawashima et al. ........... 355/53 |
| 5,130,747 | 7/1992 | Kikuiri ..................... 355/53 |
| 5,160,957 | 11/1992 | Ina et al. .................. 355/53 |
| 5,160,961 | 11/1992 | Marumo et al. .............. 355/53 |

FOREIGN PATENT DOCUMENTS 1095078 12/1967 United Kingdom ......... G02B 17/08

OTHER PUBLICATIONS

Telefax Message dated Jun. 15, 1990 from Dr. R. Wijnaendts to Mr. Bill Tobey ACT; Telefax Message dated Jun. 13, 1990 from Dr. Wijnaendts to Mr. A. C. Tobey; Patent Specification, including 4 sheets of drawing, for application entitled, "Process for Producing or Inspecting Micropatterns on Large-area Substrates".

Primary Examiner—Monroe H. Hayes
Attorney, Agent, or Firm—Townsend and Townsend/Khourie and Crew

[57] ABSTRACT

A system and method for transferring a reticle (201) pattern to a substrate image (203) by scanning. The reticle is placed between an illumination system (118) and the projection lens (117). The substrate is located below the projection lens. A loading system, wafer adjustment system, and focusing system are also disclosed.

16 Claims, 17 Drawing Sheets

METHOD AND APPARATUS FOR TRANSFER OF A RETICLE PATTERN ONTO A SUBSTRATE BY SCANNING

BACKGROUND OF THE INVENTION

The present invention relates to the field of photolithographic techniques. More specifically, one embodiment of the invention provides an improved lithographic method for fabricating a multitude of electronic devices, including those fabricated on silicon wafers such as those used for linear, power, and other applications. This method is also useful for printing multichip modules, CCDs, diskdrive heads, etc. and smaller flat panel displays. Still more specifically, the present invention relates to a manufacturing method and apparatus wherein an image from a photomask or a reticle (hereafter called a reticle) is imaged onto a photosensitive substrate by scanning means.

Currently there are three types of machines used for printing various patterns in the manufacture of electronic devices. The first type of machine is called a contact or proximity printer. This is the oldest type of machine. The reticle and substrate are in contact or close proximity and are aligned to each other. A flood exposure illuminator illuminates the reticle and thereby exposes the substrate. This machine is relatively low in complexity, and relatively low in cost, but has the large disadvantage that reticles are ruined after a certain number of uses. Manufacturers who use these machines would like to switch to one of the other two types of machines, except the cost is often unacceptable.

The second type of machine is commonly called a step and repeat camera because it moves to a specified location and prints a portion of the photosensitive substrate and then moves to another location and typically prints the same image on another portion of the substrate, repeating this process until the entire substrate is printed. Within this category, there are at least three different object to image magnifications used. Some of the machines manufactured by Nikon, Canon, GCA and others are called reduction steppers, and can print a portion of the final image at 1/5× or 1/10× magnification. The reticle area printed is equal to the image area divided by the magnification. The state of the art machines can now print image areas of up to 20 mm×20 mm at 0.45 or higher numerical aperture. Another manufacturer of step and repeat cameras, Ultratech uses a 1× magnification. The Ultratech stepper can print a field of at least 10 mm×30 mm at 0.40 numerical aperture. One disadvantage of the 2× or any non-1× step and repeat technology is the need for precise magnification control. The step and repeat technology requires very precise alignment, which requires a very expensive stage with a precise metrology system. All the step and repeat cameras are complex, expensive and very large, consuming a large area of expensive floor space. The step and repeat cameras have been designed primarily for printing dynamic memory integrated circuits. This market requires resolution down to sub-micron which in turn requires extreme performance from these machines.

The third type of machine is called a scanner. Silicon Valley Group (formerly Perkin-Elmer) and Canon both make scanners that print a 6-inch (150 mm) wide image at 1× magnification with resolutions down to about 1 micrometer. These machines are very complex and expensive. See U.S. Pat. Nos. 3,748,015 and 4,293,186. The types of lens system described in the patents consists of two mirrors and putatively forms an image of good resolution in a circle of about half the diameter of the larger mirror. The lens configuration only uses a portion of the high resolution circle, giving these machines the title "Ring field scanner." The reticle object is imaged on the substrate in the form of a circular arc. Printing is accomplished by moving both the reticle object and substrate together, with the reticle object and substrate to be printed on opposing sides of the optical system. Although a symmetric unity or 1× magnification lens system does not necessarily have any inherent distortion, the difficulty in manufacturing these optical systems causes them to have a large amount of "manufactured" optical distortion. The Canon MPA-600 and Silicon Valley Group PE700 can typically print an approximately 6-inch wide path.

Both types of machines typically use off-axis alignment techniques which require calibration and the use of more environmentally stable materials. The by-product again is increased costs and decreased productivity.

From the above information it is seen that an improved system and method for fabricating substrates is needed.

SUMMARY OF THE INVENTION

An improved system and method for fabricating substrates is provided by virtue of the present invention. The invention provides a means to expose a substrate by transferring an image from a reticle object to an image substrate with the correct image orientation and overlay to previous layers exposed onto the substrate. This process is repeated for numerous substrates quickly with a small, inexpensive, and reliable apparatus.

According to one aspect of the invention, the reticle is full sized with a unity (1×) magnification image of the entire area to be exposed on the substrate. According to a preferred embodiment of the invention, the optical system includes a small field non-inverting unity magnification relay lens system located between the reticle object and substrate, and an illuminator to cover the field of the lens. The process illuminates the transparent reticle from its backside (top). The lens system, which is composed of two 1× or unit magnification relay lenses required to provide an erect and non-inverted image, relays an image of the scanned reticle object from the front side of the reticle onto the face of the substrate.

According to a preferred embodiment of the present invention, the system provides two easily adjustable mechanisms to individually change both illuminator and lens numerical apertures. This allows the resolution of the system to be limited to the resolution requirements as defined by the users specific process. This adaptability reduces printed defects smaller than the numerical aperture can provide.

According to a preferred embodiment of the present invention, a stage system is employed to hold the reticle and substrate and move them in unison relative to lens and illumination system. The stage will further, move the substrate into alignment and focus relative to the lens, before tightly coupling the substrate and reticle together and moving them in unison. Image transfer is accomplished with a stage motion in a two dimensional serpentine pattern to transfer the image of the reticle onto the substrate through the lens.

According to a preferred embodiment of the present invention the geometry of the alignment system produces a signal that is zero at perfect alignment. The stage is servoed to that signal and, therefor does not require a stage metrology system.

According to a preferred embodiment of the present invention, in order to reduce the size of the machine, a two axis planar stage system is employed.

According to still another aspect of the present invention, a substrate loader is included to allow for automatic exchange of the substrates to and from the substrate chuck. The loader mechanism transports a substrate from a substrate storage cassette located inside the machine, to save additional space, to the flat finder in the case of silicon wafers and then to the substrate chuck in the lower portion of the stage for exposure. After exposure the substrate is transported to a second substrate storage cassette.

Focus adjustment is also provided. According to this aspect of the invention, the lens is equipped with an air gauge sensor to measure focus. The stage with reticle and substrate is moved to several different locations and local gap measurements are made with the air gauge. The substrate is then adjusted for best overall focus.

A further understanding of the nature and advantages of the inventions herein may be realized by reference to the subsequent text and attached drawings.

BRIEF DESCRIPTION OF THE DRAWINGS

FIG. 6a is a top view cutaway of the system while

DESCRIPTION OF THE PREFERRED EMBODIMENTS

Contents

Figure 1A:
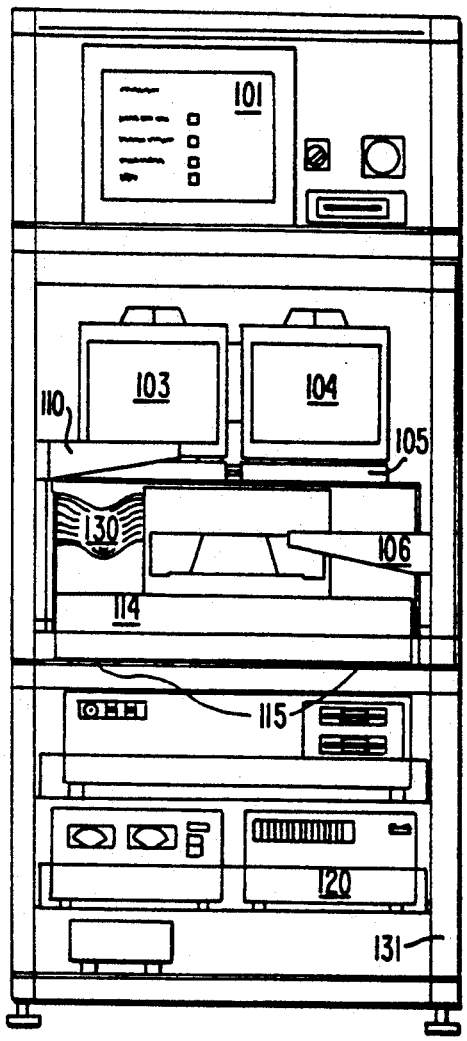
FIG. 1a is a front view of one embodiment of the invention.
Figure 1B:
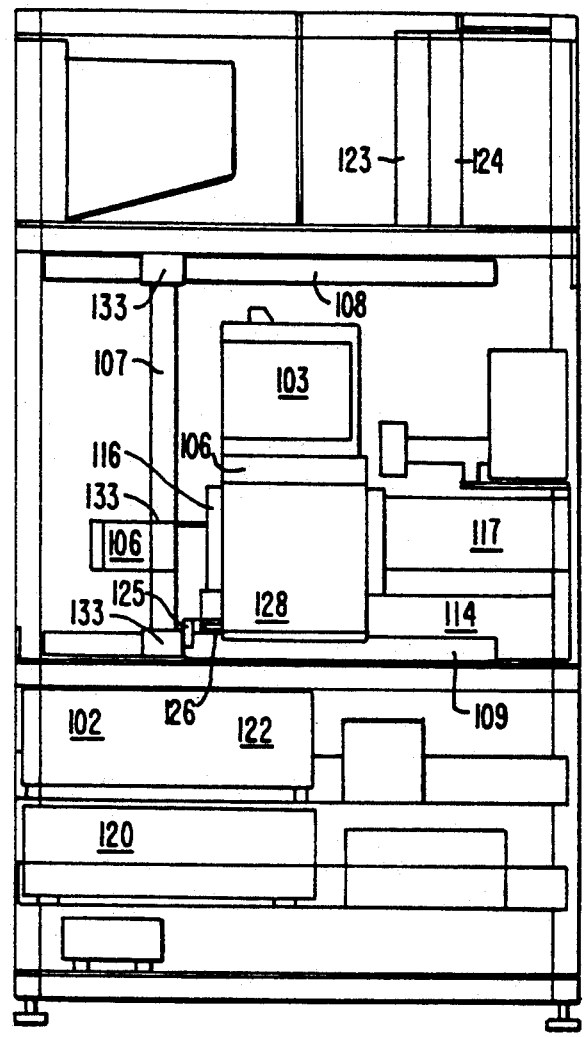
FIG. 1b is a side view of the invention.

I. Overall System Description
II. Optical Features
III. Alignment
IV. Focus
V. Stage Assembly
VI. Loader Assembly
VII. Electronics
VIII. Operation
IX. Conclusion I. Overall System Description FIGS. 1a and 1b are overall drawings of the system. The system is shown with the external enclosure panels removed to expose the internal parts. The system includes a touch sensitive input screen 101 for the user to interface with the system, modify various settings, and the like.

Containers 103 and 104 (boats or cassettes) are provided within the machine for storage of substrates. A flat finder unit 105 is provided and serves to locate the flat on silicon wafers and other substrates which use that type of alignment aid. Automatic substrate loader articulators 106, 107, 108, 109 are used to move the unexposed substrates from the substrate cassette 104 to the flat finder 105 and/or directly to stage 116. Automatic substrate unloader articulators 110, 111, 112, 113 are used to move the unexposed substrates from the stage 116 to cassette 103. Articulator parts 111, 112, 113 are identical to 107, 108 and 109, respectively, but are not shown.

A reticle, mounted on a reticle adapter frame, is loaded by the user on the top of stage 116. The stage 116 is used to hold the reticle 201 and substrate 203 (see FIG. 2) and move them together on platen 114, exposing the substrate with imagery from the reticle. A lens system 117 is used to copy reticle pattern information to the substrate 203. Illuminator 118 is used for exposing the substrate with actinic light.

A user interface computer 102, which resides inside main computer 122, operates the user interface screen and provides input to the system's main computer 122. Other electronics are also housed in the lower portion of the machine 119, 120, 121.

Clean and temperature monitored air is provided by fan 123 and HEPA filter 124. As shown, air flow is from the normally cleanest area around the system (the top rear) to the dirtiest (the front bottom) in the enclosed cabinet. The air preferably flows over the shelves in a generally horizontal pattern over the shelves, which keeps these surfaces clean. To further facilitate a clean environment, all parts within the lighography chamber have an electrically conductive and grounded surface to reduce particle collection due to static electricity.

Lamp power supply 119 provides power to the lamp 301 located in illumination system 118. Machine driver electronics 120 include the stage drivers and other items like solenoid drivers. The high power supply 121 supplies power to these functions. The controller computer 122 directs the operation of the system based on input from the user interface computer 102.

Umbilical 130 provides flexible electrical connections to the stage 116. Uninterruptable power supply 127 provides power to the computers 102 and 122 in the event of a power failure. A pneumatic isolation system 115 supports the platen 114 to isolate the platen/stage optics from outside vibrations. Air pressure and vacuum pump 129 provides all necessary pressurized air and vacuum used by the machine, eliminating the need for external air and vacuum. As a consequence of the above, the only outside requirements are 2 kilowatts. The entire device is housed in frame 131.

Due to the overall architecture of the system, only access to the front of the system is required for operation and normal maintenance. This feature yields a small footprint and the immediate ability to locate systems directly next to one another. It also provides for bulkhead mounting directly into a clean environment while being located in a less clean environment. This optical lithography architecture also produces a maximum substrate to system area ratio of less than 20:1.

The combination of elements used and described within this system produces a total weight of less than 500 pounds.

The two-dimensional scanning lithograph process outlined within produces an ability to image about 8 square inches of substrate per second (assuming 100 mJ/cm$^2$ photosensitivity).

II. Optical Features

Figure 2:
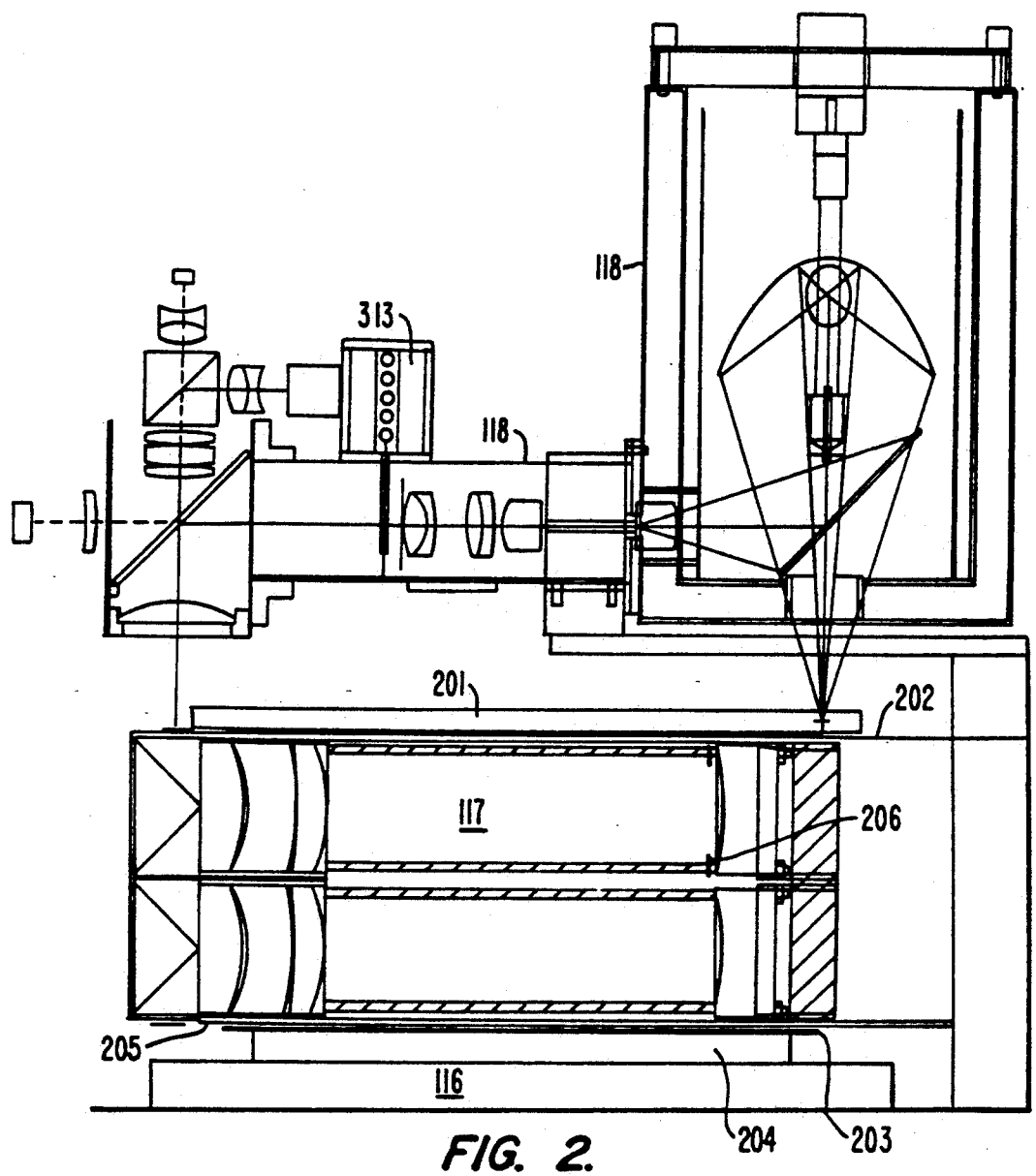
FIG. 2 is a more detailed view of the lithography assemblies.

FIG. 2 illustrates a side view of the optical and mechanical features of the substrate exposure system in greater detail. In particular, the system includes a reticle 201 which has etched thereon a mask or pattern of dark regions which block light from the illumination source so as to expose selected regions of the substrate to light. The reticle may have a pellicle 202 to protect the object surface from contamination. The reticle is oriented horizontally according to this embodiment. Below the reticle is the projection lens 117 which includes two telecentric 1× relays. Below the projection lens is a substrate 203 which is held on a substrate chuck 204 by vacuum. Alignment of the substrate 203 to the reticle 201 is accomplished by the moving of an internal stage mechanism (the substrate stage, discussed below) in response to an alignment signal generated in the illuminator 118 (see FIG. 3b). Focus is measured by an air gauge 205, and any errors in focus are adjusted by the Z, pitch, and roll motion of the substrate chuck. For purposes of this disclosure, the vertical direction in FIG. 2 is defined as the "Z" direction (otherwise referred to herein as "vertical"), while the left and right direction in FIG. 2 is defined as "Y," and the direction into the paper of FIG. 2 is the "X" direction. The yaw axis is defined as rotation about the Z axis; the pitch axis is defined as rotation about the X axis; and the roll axis is defined as rotation about the Y axis. Illuminator assembly 118 is mounted above the reticle and is stationary.

Figure 3A:
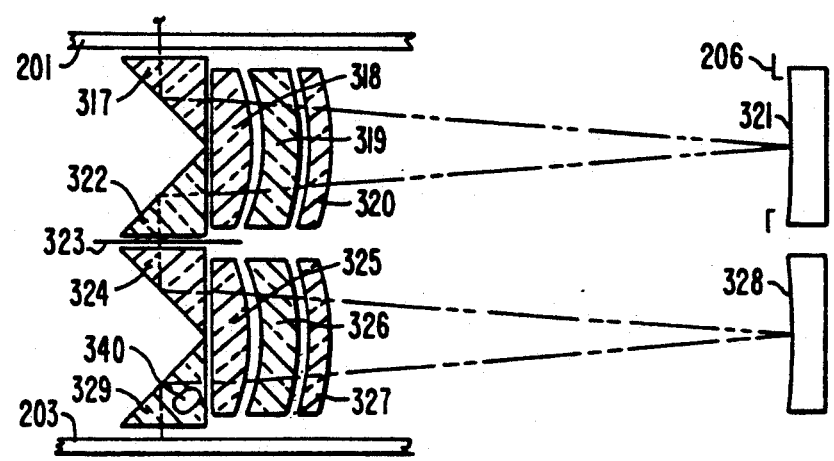
FIGS. 3a and 3b are schematic illustrations of the internal features of the optics including projection lens, illuminator, and alignment system.
Figure 3B:
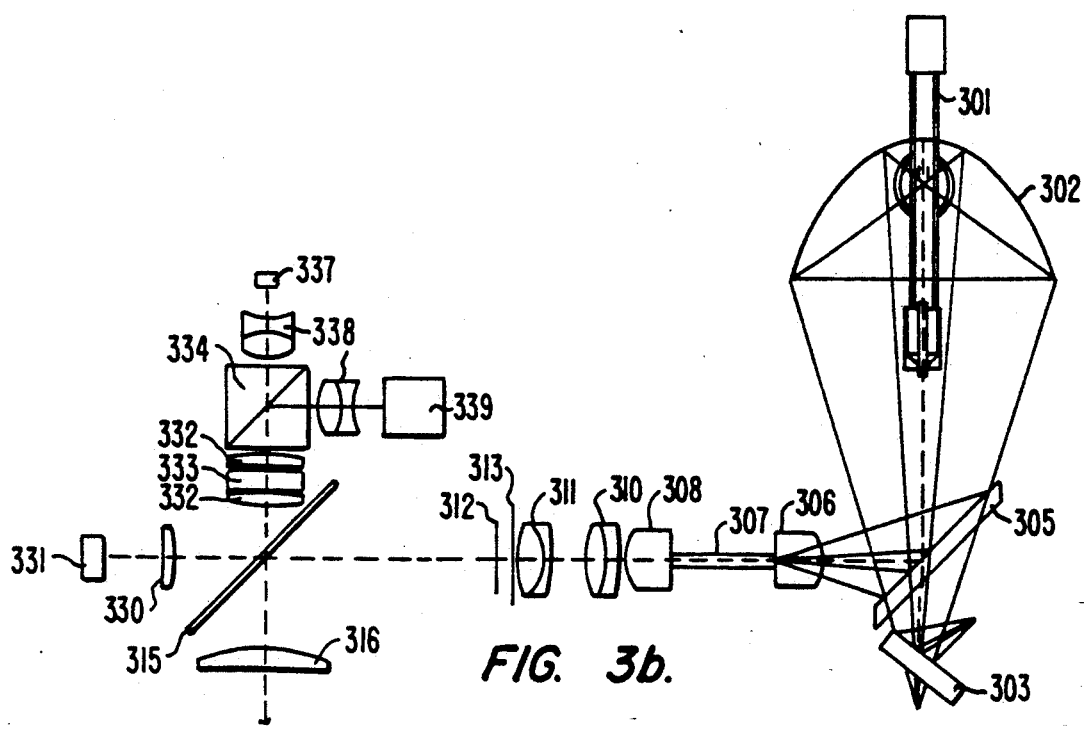

FIGS. 3a and 3b show the machine optics which include projection lens 117 and illuminator 118. FIG. 3a shows the projection lens, and FIG. 3b shows the illuminator with optics for alignment and camera viewing. In the illuminator system 118, an arc lamp 301 of sufficient power (preferably 100 to 350 watts) is located at the first focus of ellipsoidal mirror 302. Preferably, the lamp is electrically interlocked to its chamber lid, and is attached so it is removed when the lid is opened. Reflected light from the lamp, which has a spectral range from about 190 nm (nanometers) to about 1100 nm, at the first focus of ellipsoidal mirror 302, is reflected off mirror 303 onto internal lamp chamber walls. The lamp preferably is in a three-wall chamber which is cooled with air flowing on the outside thereof. The light is then reflected off partial reflecting cold mirror 305 which removes the unwanted infrared light from about 600 nm out to about 1100 nm and unwanted ultraviolet light by transmission to the mirror 303. There are two ultraviolet light rejection ranges used depending on the machine produced. In one configuration, the larger resolution system, the ultraviolet light rejected is from about 190 nm to about 300 nm. In the other configuration (a smaller resolution system) the ultraviolet light rejected is from about 190 nm to about 360 nm. The unwanted transmitted light is reflected off mirror 303 onto internal lamp chamber walls and is removed as heat. The lamp chamber is a three-walled structure to facilitate management of the excess heat from the lamp. The structure has three walls as seen in FIG. 2. Insulation is placed between the outer two walls so that the outer wall will be at ambient temperature. The inner two walls provide a large surface and air path length for heat transfer to the circulating forced air. Clean air from inside the machine lithography chamber is introduced through the bottom of the lamp chamber into the inner cavity where it cools all internal elements. It then flows between the two inner walls where it absorbs additional heat from the inner wall. The hot air then passes out an insulated high temperature hose to a vacuum source. The combination of filters reduces the actinic light range (depending on which machine) to 300 nm to 440 nm or 360 nm to 440 nm. The lamp chamber assembly, including the lamp chamber and optical elements 301–305, is attached to the rest of the illuminator 118 with precisely located pins and screws to that the optical axis of the two halves of the illuminator align, but the halves are easily separable.

Figure 3C:
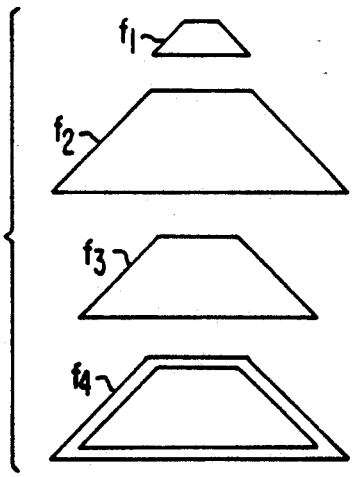
FIG. 3c is an illustration showing how the field shape is defined, including a light pipe cross-section, a magnified image of the light pipe at reticle 201, an aperture 323 cross-section and final printing field size, and an overlay image of the light pipe by aperture 323.

An immersion lens 306 is used to focus the actinic light from mirror 305 on the end of a trapezoidal shaped cross section fused silica light pipe 307 which homogenizes the light to create a more uniform output. The transmitted, homogenized light at the output end of the light pipe 307 is then coupled to the rest of the optical system by another immersion lens 308. An optical relay system including lenses 310, 311 and 316, and folded by mirror 315 is used to magnify the image from the end of light pipe 307 ($f_1$ in FIG. 3c) and refocus it on reticle 201. As shown in FIG. 3c, the illuminator field $f_2$ is trapezoidal in shape and larger in size than the trapezoidal aperture $f_3$ 323 in the projection lens and is also larger than the designed field size of the projection optics. The trapezoidal image field shape is chosen so that the length of its parallel sides are integer multiples of the 0.020-inch Sawyer motor tooth pitch so that the stage may be whole-stepped during scanning and still overlap the adjacent scanned portion of the substrate properly.

A three-position off/on/on shutter 313, which contains a green filter that transmits the 546 nm mercury line and a hole, is used to either stop all light from being transmitted through the rest of the optical system, or only allow 546 nm green light to be transmitted for use in bright field alignment, or pass all light used for substrate exposure. Mirror 315 reflects blue actinic light used for exposure and approximately 50% of the light from 500 nm to 550 nm used for bright field alignment. This mirror also transmits light from 550 nm to 600 nm used for darkfield alignment. Mirror 315 transmits a small portion of the actinic light through lens 330 to exposure detector 331 for intensity regulation.

Variable aperture iris 312 defines the numerical aperture of the illumination system. For highest performance, including depth of focus and resolution as well as printed feature characterization, the illumination numerical aperture should be smaller than the projection lens numerical aperture. This ratio, also known as partial coherence, typically should be near 0.45, but can be as low as 0.3 to as high as 0.7. If the projection lens numerical aperature is changed, which is done to reduce the printing of defects on the reticle smaller than the smallest feature to be printed, then the illuminator numerical aperture should be adjusted as well to an acceptable partial coherence ratio. Three-lens alignment is provided at the full NA of the projection lens.

Adjacent to iris 312 is a receptacle for holding a filter (not shown). Filters that can be used include neutral density and spectral bandpass. For example, to obtain the highest resolution with a lens, the user could narrow the spectral bandpass to the most ultraviolet region of the lens bandpass.

The lens 117 is mounted on a rigid one-piece cantilever structure which is rigidly mounted to the platen. The cantilever structure is made with a small length to width ratio to provide stiffness. The structure is made of steel which is stiff, stable, has a relatively low temperature coefficient of thermal expansion, and is matched to the platen. This architecture allows the lens to be straddled by the stage, but still have sufficient stiffness so that it maintains the proper image plane locations. The illuminator is rigidly and precisely mounted to the lens cantilever structure in a manner to allow easy removal, to maintain a relationship of no relative motion between the platen, lens and illuminator system.

The projection lens is mounted horizontally and includes two identical 1× magnification optical relays which is composed primarily of two Dyson lenses stacked together to form an upright image. The first optical relay includes prisms 317 and 322, lenses 318, 319 and 320, and mirror 321. The second optical relay includes prisms 324, 329, lenses 325, 326 and 327, and mirror 328. The transmitted light through the reticle from the illuminator is transmitted through prism 317, lens 318, lens 319, lens 320, and through aperature 206 to mirror 321. The light is then reflected off mirror 321, back through aperture 206, through lens 320, lens 319, lens 318, and prism 322 to aperture 323.

An aperture 206, located on mirror 321 or mirror 328, is used to reduce the numerical aperture of the projection lens system. Reducing the numerical aperture of the projection lens system, will reduce the resolution and increase depth of focus. If it is desired to print 5 micron features, using the higher resolution lens with maximum resolution about 1.5 microns, then defects on the reticle of about 1.5 microns and larger will be printed. If the resolution of the lens is reduced to 5 microns, then almost no defects smaller than that will be printed, improving product yield.

Field aperture 323 is located at the image plane of the first 1× relay and defines the actual printing field of the lenses. The aperture serves two purposes: 1) to reduce the allowable printing area to the designed field of the relay optics which has the acceptable optical performance; and 2) to vignette any over illumination from reaching the substrate (see FIG. 3c). The intermediate image at aperture 323 is reversed left to right, i.e., the long dimension of the trapezoidal image, but not top to bottom. The image from the first optical relay and aperture 323 are the object for the second optical relay. The transmitted light through the aperture 323 from the first optical relay is transmitted through prism 324, lens 325, lens 326, and lens 327 to mirror 328. The light is then reflected off mirror 328 through lens 327, lens 326, lens 325, and prism 329 to the substrate 203. The final image will again be reversed left to right with respect to the intermediate image at aperture 323, but not top to bottom. The net result is that the image of the reticle is copied to the substrate non-inverted and non-reversed, and is exactly the same size.

One of two lens systems can be used depending on resolution requirements. The first lens tabulated is considered the lower resolution lens, and the second lens is considered the higher resolution lens. Even higher resolution lenses are possible as well.

A lens for lithography with resolution at least as small as 10 micrometers using a wavelength range of 300 nanometers to 440 nanometers is tabulated below. All dimensions in the table below are shown in micrometers.

| Image Plane Radii | T0 = 3.00 Thickness | Air Material | FIG. 3a Ref. No. |
|---|---|---|---|
| R1 = plano | T1 = 26.67 | Fused silica | 317 |
| R2 = plano | T2 = 1.70 | Air | |
| R3 = 205.317 | T3 = 13.756 | Fused silica | 318 |
| R4 = 41.849 | T4 = 1.239 | Air | |
| R5 = 39.767 | T5 = 5.943 | Fused silica | 319 |
| R6 = 84.313 | T6 = 0.929 | Air | |
| R7 = 181.901 | T7 = 44.995 | Fused silica | 320 |
| R8 = 252.402 | T8 = 111.936 | Air | |
| R9 = 207.169 | | Mirror | 321 |

Note that the previous lens and the lens shown below have an object to first surface working distance of 3.0 mm which is larger than patented lenses of this type.

A lens for lithography with resolution at least as small as 1.5 micrometers using a wavelength range of 360 nanometers to 440 nanometers is tabulated below. All dimensions in the table below are shown in micrometers.

| Image Plane Radii | T0 = 3.00 Thickness | Air Material | FIG. 3a Ref. No. |
|---|---|---|---|
| R1 = plano | T1 = 26.67 | PSK3 | 317 |
| R2 = plano | T2 = 1.100 | Air | |
| R3 = 281.317 | T3 = 11.975 | FK5 | 318 |
| R4 = 48.042 | T4 = 1.100 | Air | |
| R5 = 40.934 | T5 = 14.284 | F14 | 319 |
| R6 = 68.722 | T6 = 0.300 | Air | |
| R7 = 89.857 | T7 = 12.121 | Fused silica | 320 |
| R8 = 54.631 | T8 = 154.975 | Air | |
| R9 = 235.845 | | Mirror | 321 |

Although the numerical aperture of the higher resolution lens can be reduced using aperture 206 to print 10 microns or higher feature sizes, the throughput of the overall system would be reduced beyond what is acceptable. Therefore, a second lens, which is shown above, is used for 10 microns resolution. Because it has a larger field size and a broader spectral bandwidth, it has nearly the same throughput as the higher resolution lens.

FIG. 3c compares the light pipe cross-section $f_1$, the magnified image of the light pipe on the reticle $f_2$, the aperture 323 cross-section and final printing field size, and an overlay of the image of the light pipe being vignetted by the aperture 323.

Two relay systems are used instead of a single relay system with a roof prism for three major reasons: 1) to allow for an intermediate aperture which reduces the required alignment accuracy of the illuminator to the lens; 2) to incorporate right angle prisms that are much easier to produce than roof prisms; and 3) the field size created by a roof prism is diamond shaped and is much smaller than that produced by two back to back 1× relays and thus has reduced throughput.

Light for alignment from both the reticle 201 and substrate 203 is transmitted through lens 316, mirror 315 and then relayed through beamsplitter cube 334 by lenses 332 (two of these), 333 and 338 to alignment detector 337 for determining alignment of substrate to reticle. Lens 333 is an optical element used to correct astigmatism introduced by mirror 315. Beamsplitter cube 334 allows some of the light to be imaged by the other lens 338 to camera 339 for user viewing. The alignment detector is mounted such that it is re-imaged to the center of the trapezoidal field. During the alignment process, the stage is moved so that a point on the substrate or reticle will be re-imaged at alignment detector 337 if it is moved to that location.

III. Alignment

Figure 4A:
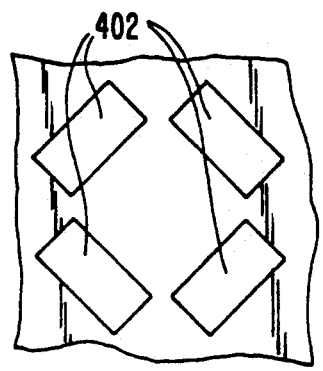
FIGS. 4a to 4f illustrate alignment features of the invention in greater detail.
Figure 4B:
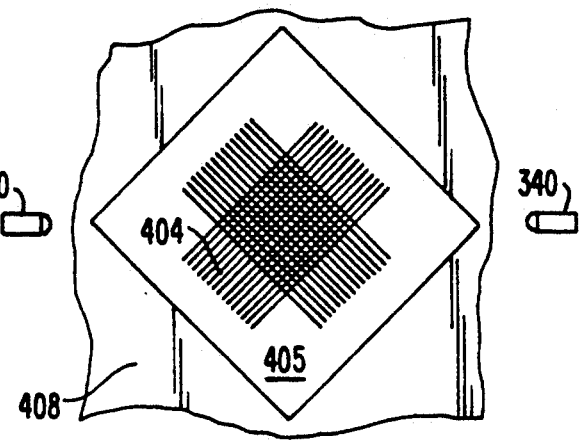
Figure 4C:
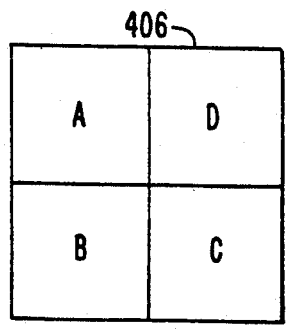
Figure 4D:
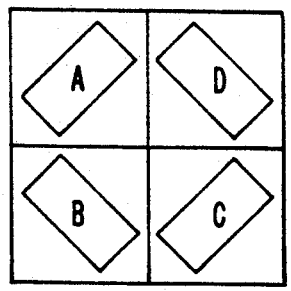
Figure 4E:
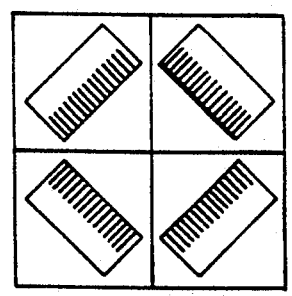
Figure 4F:
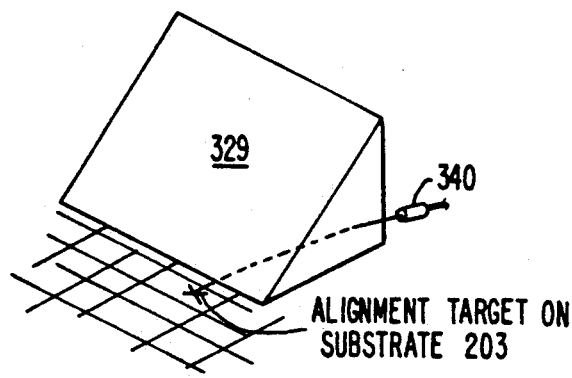

FIGS. 4a through 4e illustrate the alignment technique. FIG. 4f shows how the darkfield alignment light source illuminates the substrate target through prism 329 to provide darkfield alignment. An alignment key 402 on the reticle includes four clear rectangular windows set at 90 degrees from each other against an opaque background 403 such as shown in FIG. 4a. These four windows are oriented at 45 degrees with respect to the X and Y axes of the machine. The rectangles are the reference points for alignment. The alignment detector 406 is a four-sector photocell 408 as shown in FIG. 4c, or if the light level is too low, four separate photomultipliers 410a to 410e, as shown in FIG. 4d. The reticle key 402 is aligned to the alignment detector 337 by motion of the stage 116 as shown in FIG. 4d. On the substrate at the same relative position with respect to the reticle is a pair of crossed gratings 404, against a clear background 405 as shown in FIG. 4b. The substrate is aligned by moving the substrate stage 608 and substrate target 404 under the reticle key 402 on the reticle as shown in FIG. 4e. When darkfield light from an illumination source 340 (see light source in FIGS. 4b and 4f, preferably a non actinic source such as green LED's or green illuminator output) is directed at the substrate alignment target as shown, the left and right edges of the gratings are illuminated and the diffracted light is visible through the windows 402. The substrate target 404 is aligned in the X direction when the light intensities of detectors (FIG. 4c) $A+B=C+D$. The substrate target 404 is aligned in the Y direction when intensities at $A+D=B+C$. FIG. 4f shows one of at least two light sources in one of the preferred positions, which is mounted one on each side of the lowermost prism 329. Another preferred position would be with the light source 340 radiating into the hypotenuse of prism 329 and onto the substrate target. In the first preferred position, it is mounted at an angle so that its output shines through the side of the prism and is refracted downward and through the bottom of the same prism to illuminate the substrate alignment target. The angle at which the light from the light source irradiates the substrate target is larger than the numerical aperture of the projection lens, and is therefore working in darkfield mode. Darkfield has the advantage that feature edges is all that is seen by the alignment optics giving better alignment information than brightfield illumination does.

The reflected light from the substrate target fully fills the entrace pupil of the projection lens. This means that the alignment system uses the full numerical aperture of the projection lens providing improved sensitivity to alignment errors, which in turn should provide a higher accuracy alignment than other methods used.

V. Focus

There are two focus sub-systems used in the machine. One is an air-gauge probe system which is mounted to the underside of the lens housing 117 near the front 205. This air probe is used to gauge the mechanical distance between the lens and the substrate. This measurement is done at least three places on each substrate to determine the mean Z distance and the pitch and roll error of the substrate surface with respect to the lens. It gauges an air gap in the range of 20 micrometer to 100 micrometer with a precision of 1 micrometer. The architecture of the air probe gauge system takes the form of a pneumatic Wheatstone Bridge with the working air probe gap acting as the variable leg. Three air gap structures with exactly the same mechanical configuration and materials as the working air probe at its mid-range position are used as the other three legs of the bridge. This architecture eliminates the effects of all ambient conditions and produces a sensitive and stable gauge.

The air-gauge can also gauge what fraction of its exit aperture is covered. This feature is used to measure the position of the edge of the substrate, thereby determining the X, Y, and yaw position of the substrate with respect to the lens. Its precision in this mode is approximately 10 micrometers.

Figure 5A:
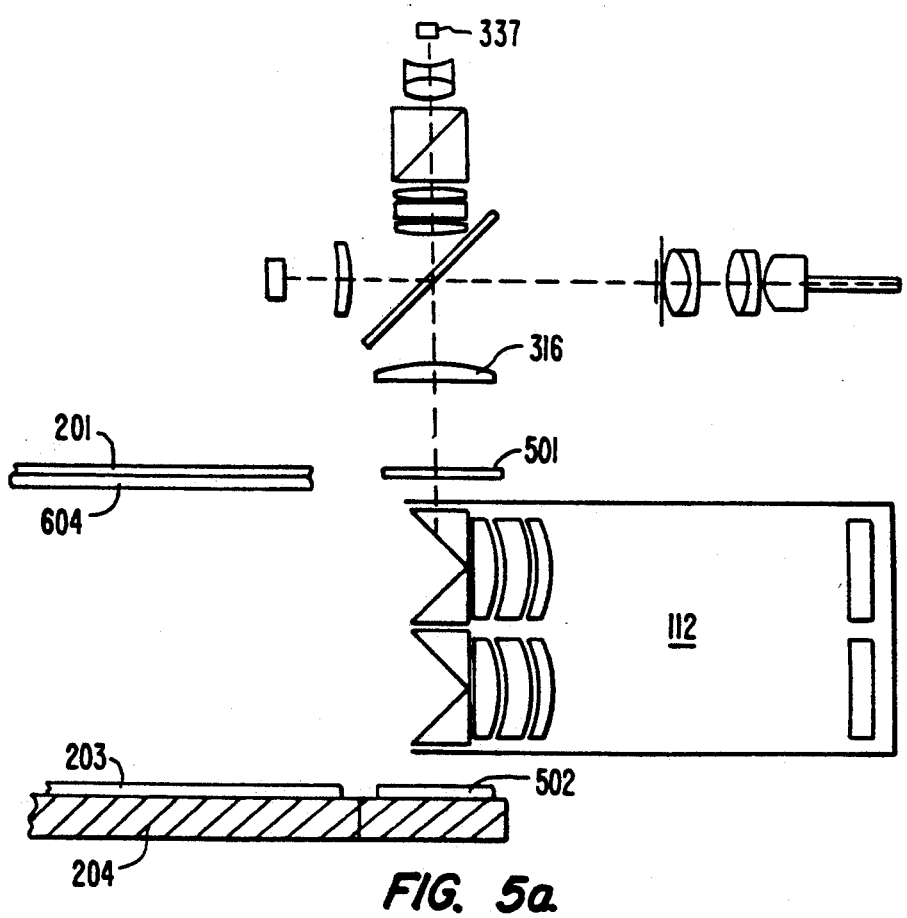
FIGS. 5a, 5b, and 5c illustrate the focus system in greater detail.
Figure 5B:
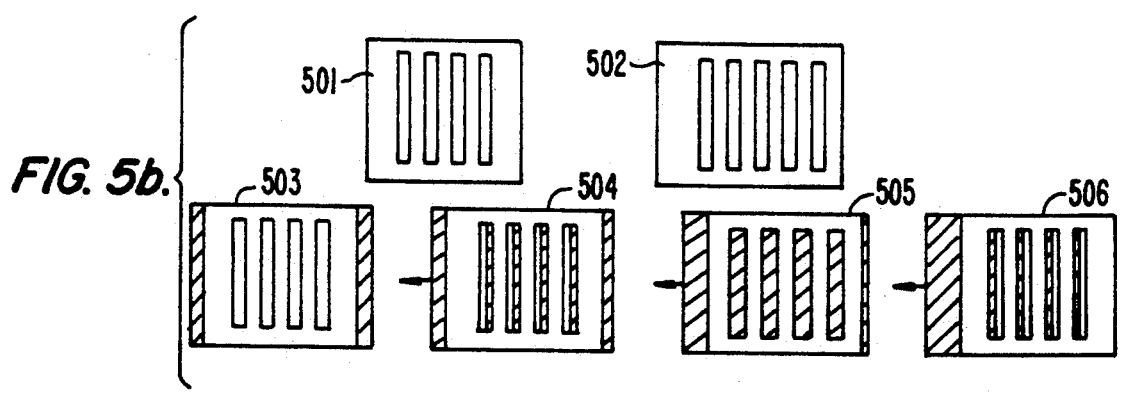
Figure 5C:
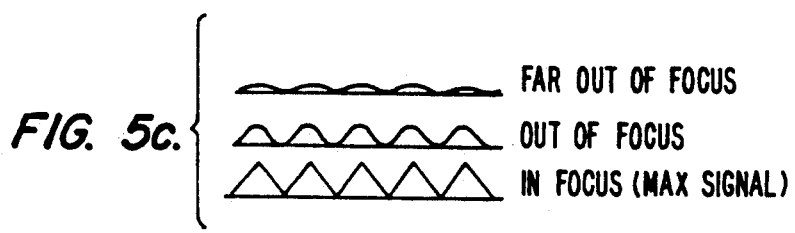

The second focus sub-system is an optical gauge which provides optical calibration for the air-gauge probe. FIG. 5 illustrates the method and device for this system. This gauge measures the position of the true image focal plane of the lens system. This information is used to periodically calibrate and remove any drift in the focus of the lens or offset in the air-gauge focus system. Two fiducial marks are used for this focus process. One mark 501 is located on the reticle stage adjacent to the reticle 201. This mark (FIG. 5b) is in the form of a 50% duty cycle one-dimensional reflective/transmitting grating with a pitch of twice the resolution of the projection lens. The "lines" in the grating are clear (transparent) in a chrome background. The gratings are oriented at 45 degrees with respect to the X and Y axes of the machine. The second mark 502 is a 50% duty cycle reflective/absorbing grating with the same pitch as the first fiducial mark. The "lines" in this grating are reflective chrome in an absorbing background such as non-reflective chrome. The second mark 502 is permanently located on a side of the substrate chuck 204 in the location which allows the lens 117 to image one fiducial mark 501 onto the other 502. The two gratings are oriented with their grating lines parallel to each other. The substrate grating 501 has an area which is large enough to be sampled by the air probe gauge 205. The top surface of this substrate grating is located at the nominal focus height, i.e., the height of the top surface of a properly focused substrate. The substrate grating mounted on the substrate chuck 204 is moved in Z by the focus actuators 603 (in FIG. 6), and is moved laterally by the substrate stage 608 relative to the reticle stage 602 which carries the reticle 201. This capability is used to drive the substrate grating relative to the reticle grating in an oscillatory motion in the axis of the grating which has periodicity (see FIG. 5b). The driving motion must be greater than one period of the grating.

Light passes from the illuminator through the reticle fiducial. The image of the reticle fiducial 501 is imaged by the projection lens 117 onto the substrate fiducial 502 which reflects a part of that image back through the lens system and into the alignment system to alignment detector 337. This technique of using the projection lens as part of the alignment optical path is known as "through-the-lens" alignment. The amplitude of the light received by the alignment detectors varies periodically as the phase is shifted between the two grating by the oscillatory motion of the substrate grating. The output is in the form of a triangular wave (FIG. 5c) when focus is best, changing to a lower amplitude sinusoidal wave when out of focus. FIG. 5b shows the substrate grating 502 being moved to the left in the figure with respect to the reticle grating 501. Pattern 503 of FIG. 5b shows the two gratings at 0 degrees phase, where the clear area in the reticle grating is aligned with the reflecting portion of the substrate grating. This corresponds to the top of the triangle wave and maximum signal output. Patterns 504 and 506 show the gratings at 90 degrees phase and 270 degrees phase, respectively, which corresponds to the signal output being half of the triangle peak. Pattern 505 shows the gratings aligned at 180 degrees phase which corresponds to the minimum signal output at the bottom of the triangle wave. The substrate chuck and therefore the substrate grating is moved in pure Z until the amplitude of the detected periodic signal is at its maximum. That height, which is the height of the true focal plane, will be transduced by the air probe gauge directed at the surface of the substrate grating. That information will be used subsequently to focus working substrates.

V. Stage Assembly

Figure 6A:
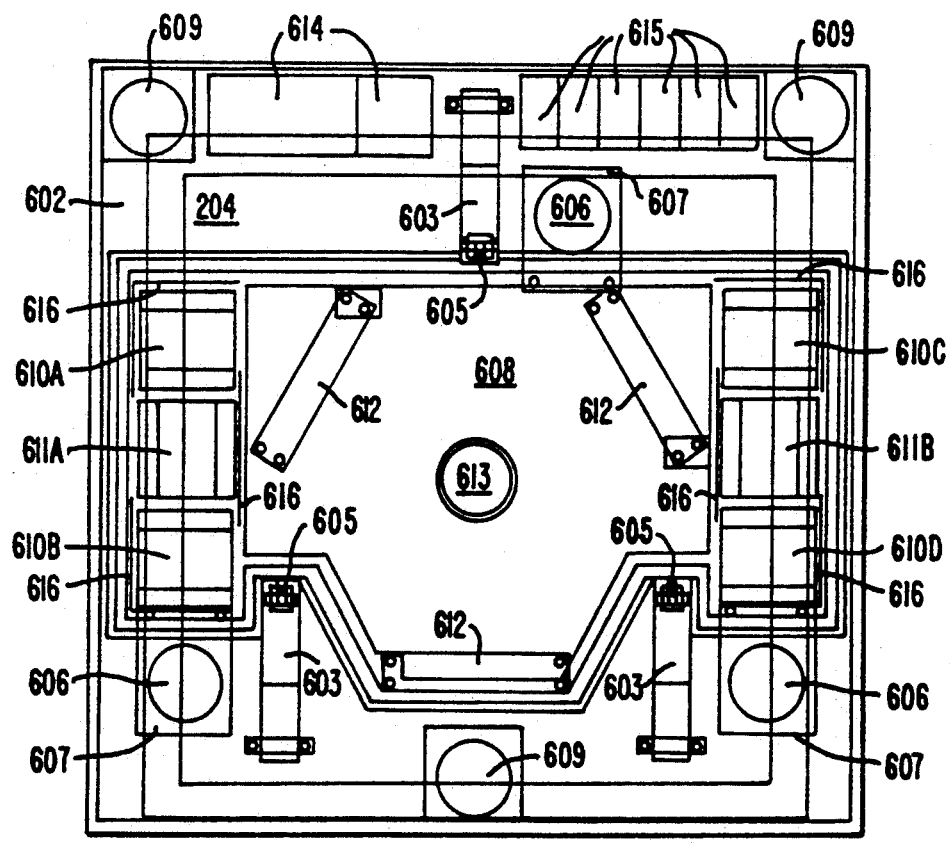
Figure 6B:
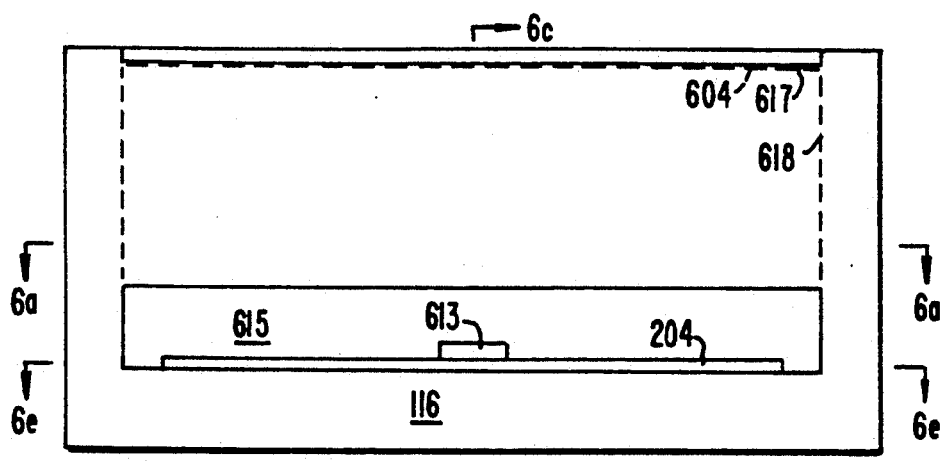
FIG. 6b is a front view.
Figure 6C:
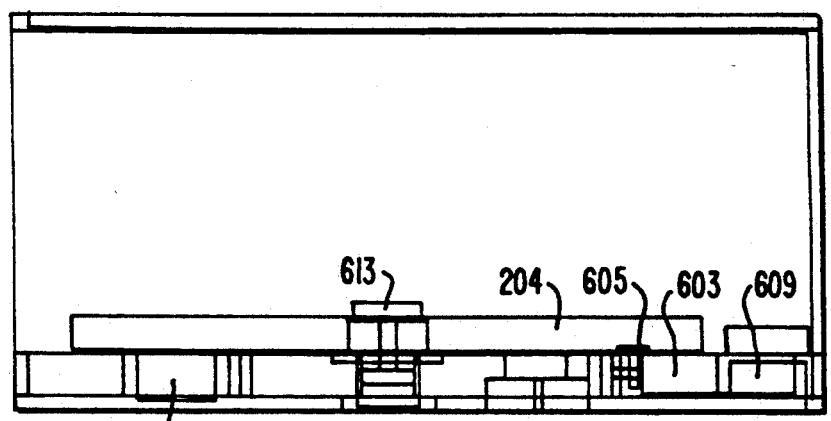
FIG. 6c is a side view.
Figure 6D:
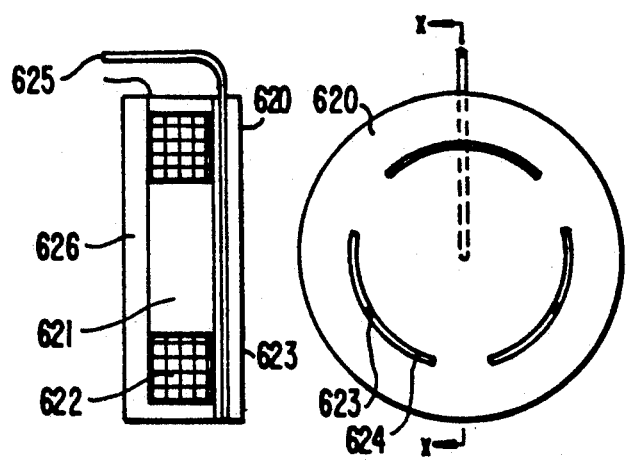
FIG. 6d is a view of the air bearing.
Figure 6E:
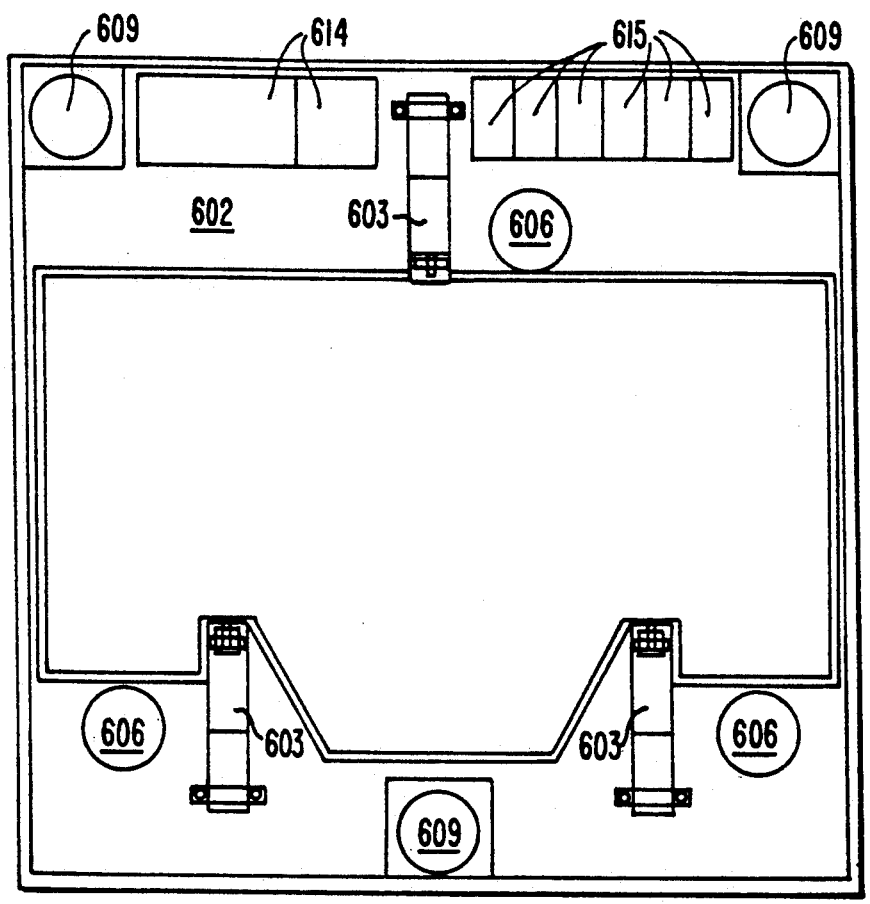
FIG. 6e is a cutaway of the reticle stage.
Figure 6F:
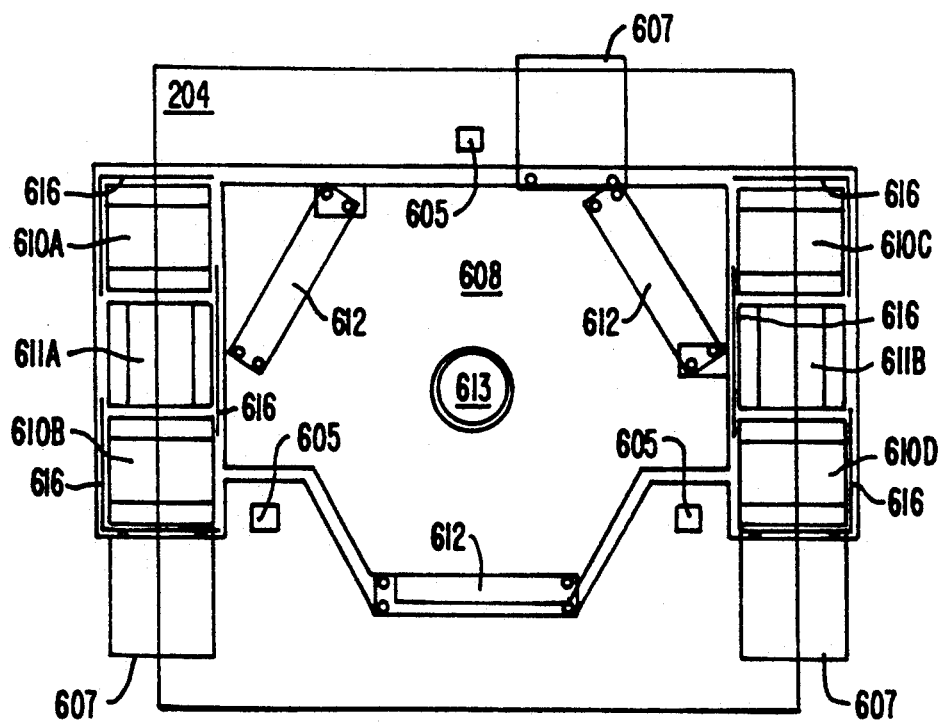
FIG. 6f is a cutaway of the substrate stage.
Figure 6G:
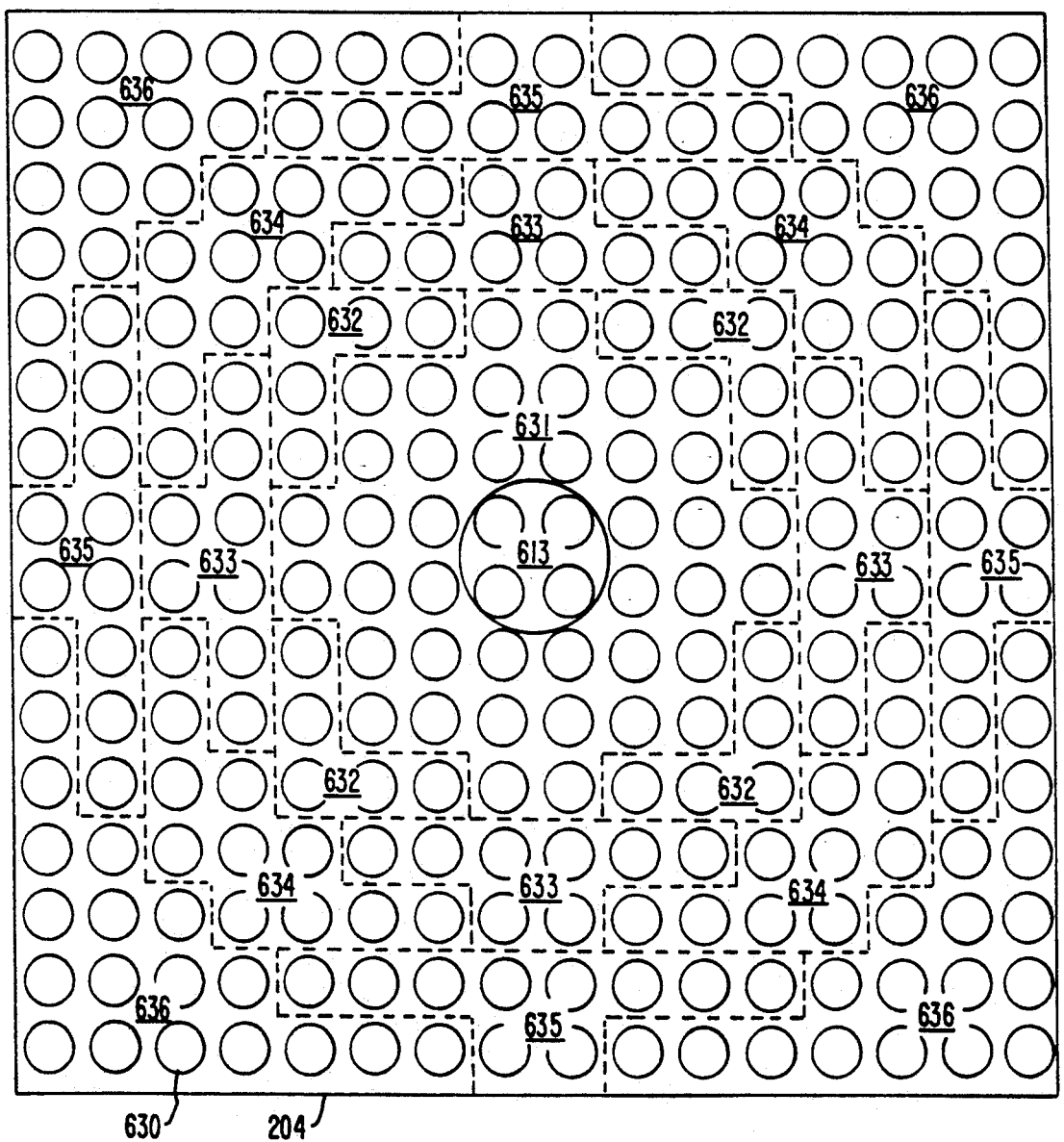
FIG. 6g is the substrate chuck.

FIGS. 6a to 6d illustrate the stage section of the device. FIG. 6a is a top view of the stage (cutaway section a—a). FIG. 6b is a front view, and FIG. 6c is a side view (cutaway section c—c). FIG. 6d illustrates the air bearing 609 in greater detail (bottom view and cutaway side view, section x—x). FIG. 6e is a top cutaway view (section e—e) showing the inside reticle stage with the substrate stage removed. FIG. 6f is a top view of the substrate stage only.

Figure 1C:
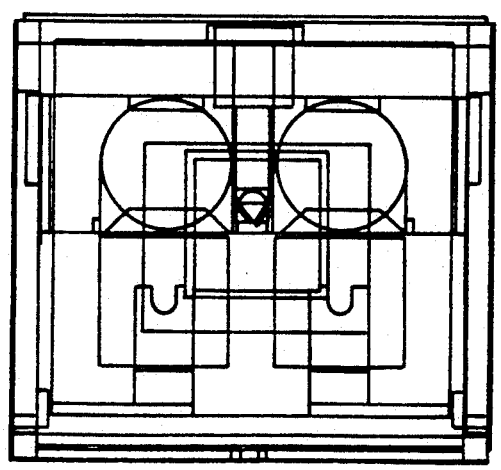
FIG. 1c is a top view of the lithography chamber—all illustrating the arrangement of the internal assemblies of the invention.

One element in the stage system is the platen 114 which is a large, stiff, stable cast iron structure. The platen has a flat top surface which is held horizontally in the machine and forms a plane on which the stage 116 travels (refer to FIG. 1). The top surface has teeth formed in its low magnetic reluctance material (such as iron) in a two dimensional array which allows the use of Sawyer motors (which provide low particle production) in the stage to propel the stage in X, Y, and yaw axes. The platen teeth act as the stator of a Sawyer motor. The top surface is further processed by filling the gaps in the teeth array with a material that has a high magnetic reluctance, that is hard and can be lapped, such as nickel or chromium, to form a solid surface on which air bearings may fly. A thin layer of additional material is added to completely cover all teeth to eliminate rust and crevices for particulates. Magnetically loaded air bearings are used extensively herein due to their low particle production and high stiffness. The top surface is then lapped very flat to allow the stage to move on it while producing a small Abbey shift between the bottom of the stage 116 where the substrate 203 rides, and the top of the stage where the reticle 201 rides. The isolation system is composed of the heavy platten 114 and air bags 115. The moving plant of the air bags, which is the constraint plane of the stage system, is placed near the center of gravity of the stage system. The platen is constructed so the constraint plane is slightly below the top surface of the platen which is also the force plane of the stage system. This relationship dictates a minimum system motion caused by the perturbing forces of the stage motion. The stage is intentionally made as light as practical, and the platen is made as heavy as practical so that the ratio of the two masses is as high as possible. This relation dictates that any forces applied to the stage are translated into an acceptably small platen acceleration. This cause and effect is important because any acceleration experienced by the platen produces acceleration and therefore displacement in the lens, illumination, and alignment systems which would degrade lithography performance.

The stage system element which transports the electrical and pneumatic needs of the stage from the machine is the stage umbilical (FIG. 1a, item 130). The umbilical is connected to a rear vertical corner of the outer stage structure. The other end of the umbilical is connected to a vertical post mounted to a rear corner of the top surface of the platen, where it then continues to the driver electronics 120 and pneumatic sources 129. The stage umbilical 130 includes two small diameter pneumatic hoses one each for vacuum and high pressure air. These hoses are bonded together and attached to an electrical cable. The cable is formed of printed wire on a thin stiff plastic sheet such as Kapton or Mylar which is wide enough to accommodate all the necessary electrical conductors side-by-side in a single layer. The cable is mounted with its width disposed vertically. The cable has low mass and has low stiffness in the plane in which the stage 116 moves to reduce the introduction of mechanical noise to stage but has high stiffness in the vertical axis such that it will follow the stage without adversely affecting its motion but will not sag and drag on the platen.

The stage 116 includes an outer box (reticle stage, FIG. 6e) 602 and an inner transport system (substrate stage, FIG. 6f) 608. The reticle stage 602 includes a reticle chuck 604, three magnetically loaded air bearings 609, three inter-stage couplers 606, three focus actuators 603, miniature solenoid valves 615 for controlling the pneumatic functions, and pneumatic reservoirs for vacuum and high pressure air 614.

The reticle stage structure 602 is formed of a high specific stiffness material such as aluminum, with thin solid walls to form a light but stiff structure.

The reticle stage 602 is supported on the bottom by three magnetically loaded air bearings 609 which fly on the platen 114. The air bearings provide a stiff frictionless support for the reticle stage 602 and constrain it to move strictly in the X, Y plane. Each air bearing, as shown in FIG. 6d, includes a replaceable air bearing surface 620, a permanent magnet 621, an electromagnetic coil 622, and a top cup 626 of iron which completes the magnetic circuit for both the coil and permanent magnet. The replaceable air bearing surface 620 is a thin flat piece of hard material. In the face of the hard material, which will act as the bearing surface, there are three orifices 623 feeding three small grooves 624 which form three air bearing elements. They receive air through air inlet tube 625. The air bearing face 620 is attached to, but removable from, the other parts of the air bearing assembly in case the surface is scratched or the orifices plugged. Another part is the permanent magnet 621 which is made of a high B permanent magnet material. It takes the form of a pulling magnet with a small air gap between its poles and the platen which the air bearing flies on. It is oriented to exert its force vector toward the platen through the center of the replaceable air bearing surface 620 part so as to equally preload each of the three air bearing elements 624. The third part of the air bearing is an electromagnetic coil 622. This coil of high conductivity wire is oriented concentrically about the permanent magnet and as part of the same magnetic circuit as the permanent magnet. Its electromagnetic and thermal properties allow the coil to be pulsed with a short high current to temporarily counteract the high force produced by the permanent magnet. This action allows the air bearing to be inflated to its proper flying height from a position in contact with the platen. Another reason for the coil is that it may be energized with a much smaller current which may be controlled to modulate the total magnetic loading force, and therefore the flying height of the air bearing.

The reticle stage 602 has a large opening in the top horizontal surface which forms an exposable area through which light may pass through the reticle 201 and into the top of lens 117. Around the opening of the reticle chuck are kinematic mounting points and vacuum pads 617 to support and hold the reticle frame in the proper position in the large opening in the reticle stage 602. The proper position is defined as the position where the image of the bottom surface of the reticle is coplanar with and at the nominal focal plane of the upper relay lens 117. The reticle mounting frame provides two important features. First, it reduces the need to physically contact the reticle during the installation process. This in turn, reduces potential contamination and breakage problems. Second, it provides a means to mount and use more common size reticles which are smaller than the maximum allowed by design.

The reticle stage 602 has a slot opening in its front surface 615 through which the substrate is presented to the substrate chuck 204 by the substrate loader arm 106. The slot opening is just large enough to allow the substrate on the loader arm to pass and allow clearance for the arm to deposit or remove the substrate 203 onto or from the chuck 204, and allow clearance for any relative motion between the stage 116, which is on an isolation system 115, and the loader, which is not.

The reticle stage 602 has a large opening 618 in its rear surface through which the lens 117 intrudes and may scan the entire top surface of the substrate with its image plane located just below the lower prism surface and simultaneously scan the entire bottom surface of the reticle with its object plane located just above the upper prism surface. The large opening is large enough to allow the lens to overlap the edge of the substrate on both sides by an amount slightly greater than half the lens width and to allow some clearance between the lens housing and the reticle stage side walls.

The reticle stage 602 also contains three focus actuators 603 mounted inside to the floor of 602 to support the substrate chuck 204 which sets and slides on their adjustable points 605 thereby forming a plane nominally parallel to the reticle and platen but adjustable in height (Z), pitch (p), and roll (r). Each focus actuator is a standard small DC motor with a gear box which drives an eccentric cam which forms the hub of a circular ball bearing. The focus actuator is mounted with its major axis horizontal such that when the motor is driven, the highest point of the outer circular edge of the bearing (which does not rotate) may be in contact with and move the substrate chuck in a vertical motion.

The reticle stage 602 also contains three inter-stage couplers 606 mounted inside to the floor. The inter-stage couplers are assemblies which can be controlled to couple or de-couple the reticle stage 602 and substrate stage 608 to move in the X, Y plane dependently or independently, respectively. Each stage coupler 606 is an electromagnet/air bearing assembly. A corresponding steel coupler flexure 607 is mounted on the substrate stage 608 and forms the other half of the coupling. When the electromagnet is deactivated the air bearing forces the surfaces of the electromagnetic/air bearing assembly 606 and the coupler flexure 607 apart allowing the reticle stage 602 and substrate stage 608 to move relative to each other. When the electromagnet is activated it overcomes the air bearing and forces the coupler flexure surface tightly together with the electromagnetic/air bearing surface where friction disallows relative motion. Controlling the coupling unit with an electromagnet rather than with the air bearing pressure significantly increases both reaction speed and reliability.

The reticle stage 602 also contains two pneumatic reservoirs 614 elastically mounted inside to the floor. One is a volume used to store vacuum, the other stores high pressure air. These reservoirs provide an immediately available low impedance source for the pneumatic functions and allow the pneumatic hoses in the stage umbilical to be of small diameter since they only need to accommodate the long term needs of the stage.

The substrate stage 608 includes a structure with integral air bearings 616, two sets of Sawyer motors 610A-C and 611A-B, a substrate chuck assembly 204, and three inter-stage coupling flexures 607.

The substrate stage 608 is formed of a high specific stiffness material such as aluminum, with thin solid walls to form a light but stiff structure to which the other elements are fastened. Formed in the bottom surface of the substrate stage 608 are air bearings 616 adjacent to the Sawyer motors which support the substrate stage 608 off the platen. The air bearings are magnetically loaded toward the platen by the Sawyer motors and are located to support each of the two motor sets in Z, pitch and roll, to keep the motors from rubbing on the platen or bending the substrate stage structure and causing it to rub on the platen. The air bearings need not be extremely stiff so they have a relatively high flying height and are not replaceable as individual elements.

The Sawyer motors 610 and 611 are mounted to the substrate stage structure 608 with their bottom surface coplanar with the air bearings 609 on the bottom of the reticle stage 602. They fly on the platen surface 114 on integral air bearings and propel the stage relative to the platen when the magnetic poles of each segment are controlled by appropriate electrical excitation.

The two sets of three motors are disposed on opposite sides of the stage (in X) with their major axis in line with the predominate stage axis (Y). Each set of Sawyer motors can move in X and Y and the two sets driven differentially create a yaw motion. The motors are placed such that they produce force through the center of mass of the stage (in the X, Y plane) so as to not produce yaw torques when linear motion is commanded.

The two sets of Sawyer motors includes three motor pairs, two pairs 610A-D disposed to propel the stage in its predominant axis (Y), and one pair 611A-B to propel it in (X). Each motor contains a pair of motor segments which are controlled with their phases in quadrature. Two pairs of Y motors are used to provide maximum agility and motion smoothness in the Y direction which is the dominant scan axis. Only one pair of motors is used for X motion to save weight and because only a small step is made in X during exposure so the contribution to throughput by the X stage motion is small.

The Sawyer motors are controlled with the two X motors in the system receiving the same excitation, the two Y motors in each set receiving the same excitation, and the Y motor sets receiving opposite differential excitation to control yaw motion.

The excitation for the motors is a symmetric 50% duty cycle triangle wave of oscillating current which is symmetric in amplitude about zero. This excitation provides a piece-wise linear relationship between excitation phase, and displacement or force.

The substrate chuck 204 provides a flat surface on which the substrate is placed so that it may be held flat and focussed. The chuck has a top surface which is large enough to properly support the largest substrate intended for the machine. The chuck is made of a stable, high specific stiffness material such as Aluminum.

The chuck is coupled by flexures 612 to the substrate stage 608 such that it is rigidly constrained in the three axes of the horizontal plane (X, Y, yaw), but may freely move in the other three axes controlled by the focus actuators (Z, pitch, roll). The substrate chuck is magnetically loaded against the focus actuators to augment gravity and insure intimate contact. The chuck is referenced to the reticle stage for focus because the Sawyer motors bounce slightly in Z as they move in X and Y. This motion if coupled to the chuck would detrimentally affect image focus.

The chuck has a top surface which is very flat, hard, electrically conductive, and grounded. The areas on the bottom of the chuck where the focus actuators contact and slide must also be very flat, smooth, low stiction, and hard. The chuck could be plated with nickel or chromium.

The substrate chuck 204 (FIG. 6g) has a top surface which is covered with many shallow depressions 630 which are evacuated to hold the substrate flat and securely to the chuck, or alternatively vented to atmosphere to release the substrate from the chuck and eliminate any sliding friction. The depressions will be pneumatically linked together in zones. The innermost zone is intended to be covered by a small diameter round substrate. The inner zone includes all of the shallow depressions 630 in the chuck which would be completely covered by the small substrate. The next zone 632 includes those depressions which when added to the inner zone 631 would be completely covered by a square substrate whose side dimension is greater than or equal to the diameter of the inner zone. Each additional zone forms an increasingly larger zone which alternate in shape between square and round (633, 634, 635, 636). Each of the zones are linked to a common pneumatic plenum through separate flow restricting orifices such that all zones may be controlled simultaneously without a catastrophic loss of either vacuum or pressure due to zones which are not covered by a substrate.

Attached to the substrate chuck and capable of protruding up through the center of the substrate chuck is a smaller pop-up chuck 613. The pop-up has the ability to move vertically between two positions. This vertical motion must be smooth and must not produce errors in position in any axis which the substrate loading system or the substrate alignment system cannot accommodate. The down position is such that the top surface of the pop-up chuck is below the top surface of the substrate chuck. The up position is such that the bottom surface of the substrate is far enough above the top surface of the substrate chuck for the substrate loader arm to pickup or deposit a substrate with appropriate clearance.

The pop-up chuck is just large enough in diameter to stably support a substrate, and small enough such that the substrate on the substrate chuck does not sag an appreciable fraction of the depth of focus of the machine's lens due to gravity in the center where the pop-up is.

The pop-up chuck also has four shallow spots in its flat top surface with which to hold a substrate with vacuum or vent to ambient pressure.

Other embodiments of the invention will be useful, particularly when very large (e.g., greater than about 8- to 12-inch) wafers are to be processed. For example, it will be desirable to fix the position of the substrate and reticle chucks, and move the illuminator and the lens system in synchronization. Further, it will be desirable with large substrates to orient the substrate and reticle in a vertical position (i.e., such that the wafer and reticle "hang" from the top portion of the system) which will prevent distortion due to sagging created by the gravitational pull on the wafer and the reticle. It is also desirable that substrates and reticles are stored and manipulated in a substantially vertical orientation.

VI. Loader Assembly

FIGS. 1a and 1b also illustrate the loader mechanism. The system allows for the automatic transfer of substrates onto and off of the stage. The function is necessary to improve throughput and reduce substrate contamination exposure. The loader is comprised of three main elements. They are the carriage unit 128, substrate load articulator (on right side of machine) 106–109, and substrate unload articulator (on left side of machine) 110–113 (111–113 not shown). The substrate load and unload articulators are mirror images of each other. The load articulator is identified as such because of its access to the substrate prealign unit 105. Each of these elements are connected to the machine frame 131. To reduce vibrations that might be caused by the loader system and other sources, the platen 114, stage 116, and optics 117 and 118 are isolated by isolators 115. This isolation allows the substrate load and unload activities to occur during substrate lithography, with no effect to the quality of that lithography. The substrate prealign unit 105 coarsely orientates substrates in yaw. The carriage unit 128 supports two substrate cassettes 103 and 104 and the substrate prealign unit 105 previously mentioned. The interface between the carriage and the cassettes is configurable to allow for various size cassettes.

The carriage unit can be moved along the front to back (Y axis) on bearing guide ways 109 and 113 (lower). This motion is supported to allow the carriage unit to assume two special positions. The front most position, allows the user to easily access the substrate cassettes 103 and 104. The back most position allows the substrate load articulator to access any of the substrates within the substrate load cassette or the substrate prealign unit. The back most position also allows the substrate unload articulator to access any of the positions within the substrate unload cassette. The substrate carriage is moved by temporarily linking it to and moving the substrate load articulator 106-109. This linkage is established through an actuator 125 that engages into a receptacle socket 126 on the substrate load articulators Y motor assembly.

The substrate prealign unit 105 is comprised of a substrate vacuum chuck 702, shown in FIG. 7, which is attached to a motor underneath it that allows a substrate to be rotated. The substrate 203 is held to the prealign chuck 702 by vacuum. This vacuum may be removed so that the substrate can be removed by venting the vacuum through the prealign vacuum solenoid valve. A prealign vacuum switch located pneumatically between the vacuum chuck 702 and solenoid valve provides a means for the system to verify the presence of a substrate. Four linear arrays 700 of optical sensors provide feedback to locate and position the substrate in the correct yaw orientation.

Figure 7A:
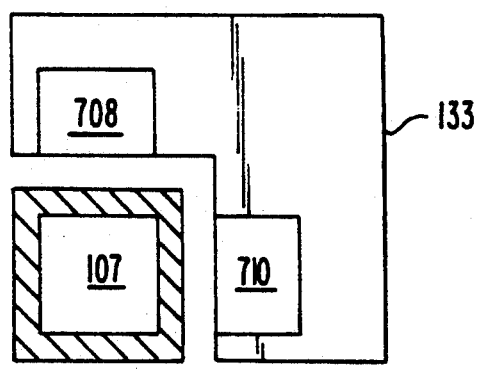
FIGS. 7a and 7b illustrate part of the loader mechanism in greater detail.

Each of the two substrate articulator arms (106 and 110) have two degrees of freedom (Y and Z). The substrate load articulator Z axis guide bar 107 is transported in Y by two Sawyer motor assemblies 133 that move along guide bars 108 and 109. The substrate articulator arms (106 and 110) are mechanically attached to Sawyer motor assemblies 133 that move along guide bars 107 and 111, respectively. Each Sawyer motor guide bar in combination with the Sawyer motor assemblies 133 constrains motor motions to a single axis. FIG. 7a shows a typical loader guide bar/Sawyer motor assembly 133 interface in cross-section. Sawyer motor/air bearing 708 is propelled and positioned along a guide bar (one of six) and fixes the assembly 133 in two degrees of freedom. Permanent magnet/air bearing 710 that flies above the guide bar constrains Sawyer motor 708 in the other three degrees of freedom. The upper Y motion Sawyer motor 133 is flexured to 107 to allow small motions in the Y and Z axis so that it does not fight the lower motor.

Figure 7B:
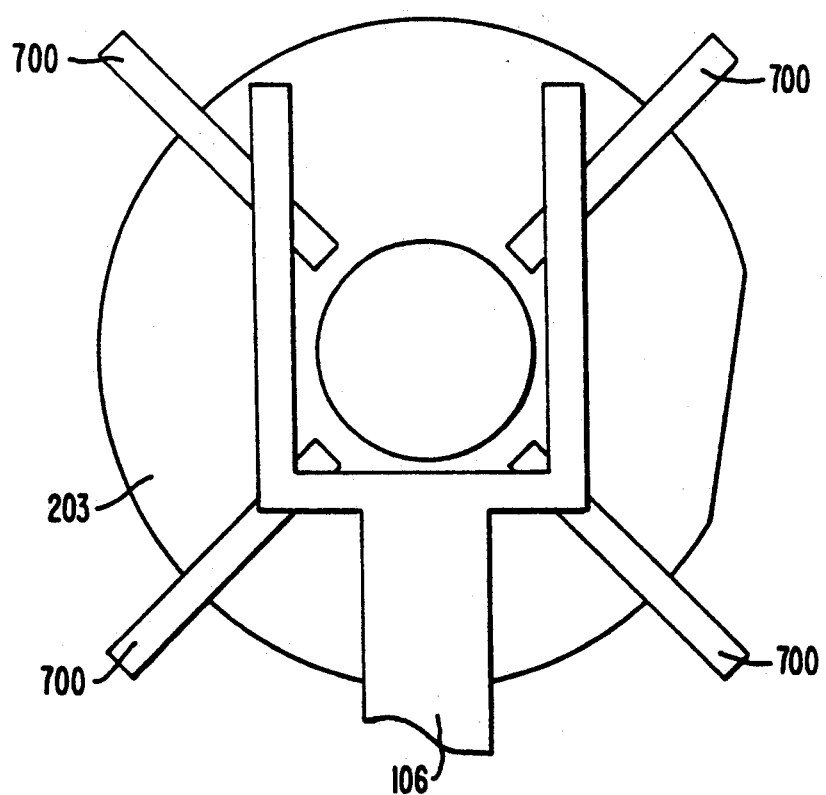

To insure that the substrate is not dropped or positioned incorrectly, vacuum is used to hold the substrate 203 on the substrate loader fork 106, as shown in FIG. 7b, which is at the end of the substrate loader arm. The substrate may be released by venting the vacuum through the substrate articulator loader arm solenoid valve. A vacuum switch located pneumatically between the fork vacuum channel and the fork solenoid valve provides feedback to the system when a substrate is being successfully held by vacuum.

Each substrate arm also has an optical interrupter-type sensor attached to its end. The optical interrupter sensor is used for scanning a cassette of substrates to determine the population and position of any substrate. In order to transfer substrates onto or off of the stage, the stage (and thus the platen) must be at a position in space which is known by the substrate articulator controller.

The X, Y, yaw, Z coordinate space between the loader and stage are correlated through a calibration procedure. This calibration consists of loading and aligning a special test substrate. The X, Y, yaw, Z offsets required to align that substrate are then stored and used to precisely load subsequent substrates.

VII. Electronics

Figure 8:
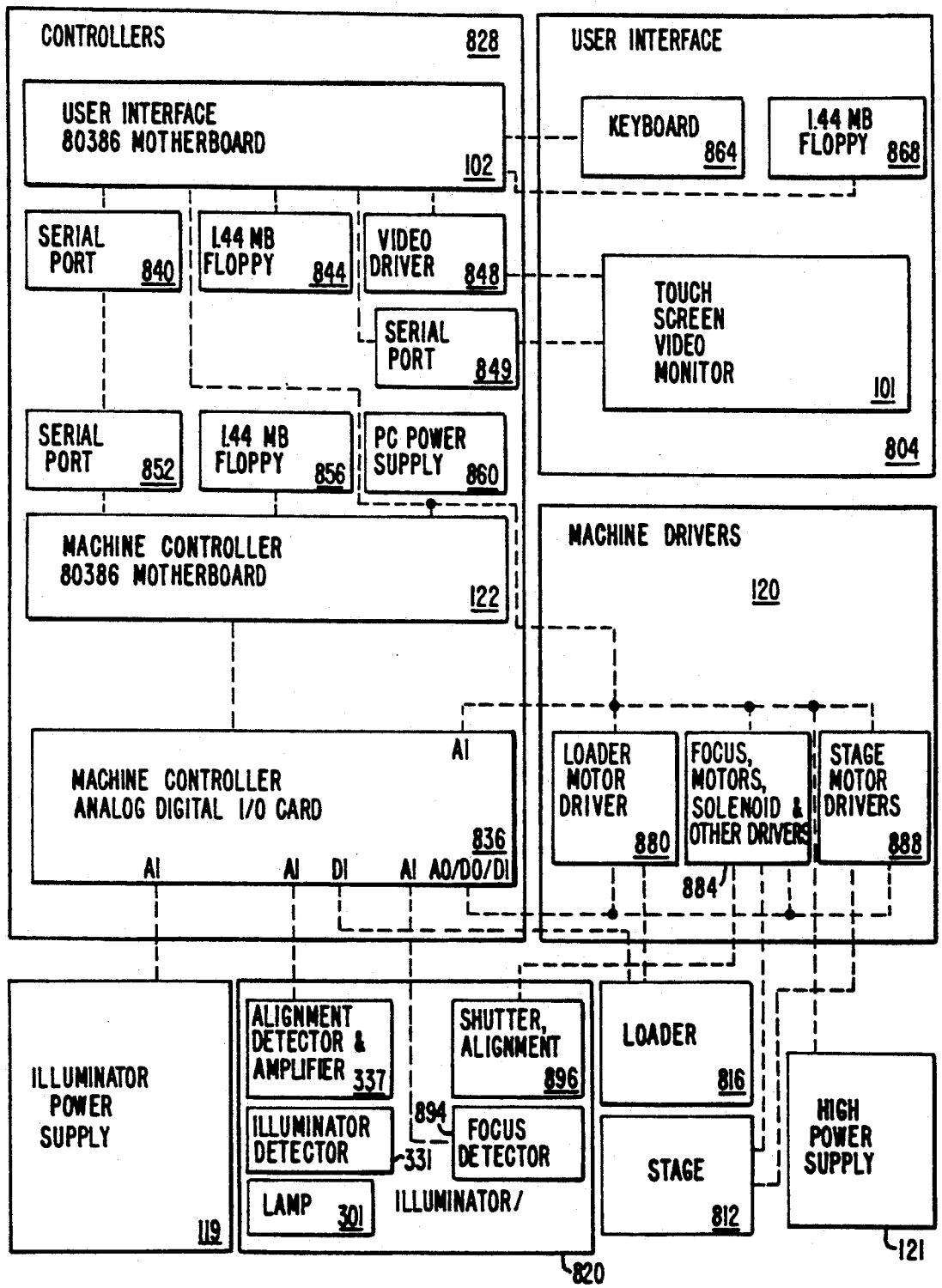
FIG. 8 illustrates the architecture of the control system.

FIG. 8 illustrates the electronic architecture of the system. A single chassis 828 may house both of the computer controllers in the machine 102 and 122. This chassis would be mounted to a drawer slide in the lower part of the machine for maximum accessability. Both the user interface computer 102 and the machine controller computer 122 would be personal computer-type motherboards with 80386 microprocessors. The two computers communicate with each other through their respective serial ports 840 and 852. Both computers are booted and have their main program in their respective floppy disc drives 844 and 856. Both computers derive their power from a common PC power supply 860.

It is the main task of the user interface computer 102 to control the user interface elements 804: keyboard 864, user job file floppy disc drive 868, and the touch screen video monitor 101. The keyboard is not permanently mounted to the machine, but is attachable to provide maintenance and process engineers access to special functions within the machine. It interfaces directly to the user interface computer board. The video monitor is driven by the user interface computer through a video driver card 848. The touch screen function of the video monitor is driven through another serial port 849.

The machine controller computer 122 controls the individual electrical actuator and sensor elements in the machine through a general purpose analog/digital input/output printed circuit card 836. Its analog outputs are used for functions like driving the focus actuator DC motors. The analog inputs are used to sense the signals produced by the focus gauge and the alignment system. The many single-bit digital outputs are used to control actuators like solenoid valves. The multiple-bit digital output channels are used to control the Sawyer motor drivers. The digital inputs are used to sense the single-bit functions like pressure or vacuum switches.

The remote user interface system 804 is mounted on the front and top of the machine for best human interaction. As described previously, this system is driven by the user interface computer 102 mounted in the lower part of the machine in the controllers box 828. The floppy disc drive 868 allows the user to input preprogrammed job-specific instructions and process data. The video touch screen presents all necessary information to the user. The touch screen 101 feature allows the user to select machine operating modes and data screens.

The machine drivers 120 are all the high power actuator drivers for the machine. It includes Sawyer motor drivers for the stage and substrate loader, 888 and 880, respectively, and various power drivers for the DC focus motors and solenoids 884. The loader motor drivers 880 operate strictly in the whole step mode. They are switch mode bipolar current amplifiers which produce the triangle wave current required by the Sawyer motors. The stage motor drivers 888 are also switch mode current amplifiers which produce triangle wave current. Additionally, the stage motor drivers must be controllable in the micro-stepping mode to 12-bit precision so that the 0.02-inch pole pitch stage motors can be micro-positioned during alignment to 0.10 microns.

The machine drivers 120 are all powered by a set of large high power supplies 121. These power supplies are mounted to the same drawer as the machine drivers and include a 24 VDC supply for the solenoids and a ±36 VDC high current supply for the Sawyer motors. The high voltage is required to drive the required current at the high frequencies associated with the high stage speeds commanded during machine operation.

The illuminator power supply 119 drives the mercury arc lamp used in the machine. The power supply has interfaces with the machine controller 836 and the illuminator 820. The interface with the machine controller is to provide the controller with lamp voltage and power information. The interface with the illumination system is through a shielded high voltage cable to drive the lamp, and to the illumination detector 331 used as feedback to control the lamp to a constant optical power.

The illumination electrical system 820 includes the alignment detection function 337, the focus detection function 894, control of the shutter and the darkfield illumination devices 896, and the mercury arc lamp 301 and illumination detector 331 mentioned above. The alignment detection 337 is performed by a quad-cell photodiode. The four signals generated by the alignment optical signal are amplified and sent to the machine controller I/O card 836 as analog signals. The focus detection electronics 894 includes differential amplifiers to sense the imbalance in the pressure transducer bridges, and buffer amplifiers to compare the signals and drive the signals back to the machine controller I/O card 836. The shutter driver and alignment illumination drive are simple on/off drivers 896. The alignment illumination is a pair of green light-emitting diodes 340 used for illumination in the darkfield alignment system. The illuminator detector 331 includes a photodiode and an amplifier to drive the signal back to the illuminator power supply 119. The illuminator lamp 301 is a mercury arc lamp. It is driven from the illuminator power supply 119. The drive power involves relatively high power and high electrical noise emissions, so the cable is well insulated and shielded. In the lamp chamber of illuminator 118, the lamp drive cable must also withstand the high temperature and ultraviolet radiation environment. To facilitate maintenance and safety, the lamp is attached to the removable lid of the lamp chamber and includes a connector mechanism for the other end of the lamp. When the lid is removed, the lamp is also removed and both of the electrical connections are automatically broken.

The loader electrical system 816 includes Sawyer motors for Y and Z motion on both sides of the machine, vacuum control for the substrate forks 106 and 110, rotation and vacuum control for the prealigner chuck 702, and illumination and sensing electronics for the flat finder sensors 700.

The stage electrical system 812 includes Sawyer motors for X, Y, and yaw motions 610A-D and 611A-B, three DC motors for the focus actuators 603, the solenoids used in the inter-stage couplers 606, drivers to raise/lower the pop-up chuck 613 in the substrate chuck 204 and control its vacuum, solenoid valves to control the vacuum to the substrate chuck 204, and the electromagnetic coils and actuators to control the high pressure air in the stage air bearings 609. Vacuum and pressure switches will also be required to sense the successful switching of vacuum and air pressure on the stage. Of the functions mentioned above, the actuators for the pneumatic functions are solenoid valves 604. All of the electrical signals pass through the stage umbilical 130.

VIII. Operation

During normal operation, substrate cassettes are exchanged in the following manner. First, a command from the user is received to exchange substrate cassettes. The system continues processing any substrates currently on the stage or the substrate load fork or prealign chuck. Any substrates on the stage are transferred to the unload cassette. Both load and unload articulator substrate forks 106 and 110 are driven in the Z direction to the substrate prealign station elevation. Both load and unload articulators are driven toward the back of the machine (+Y direction) to engage the carriage actuator 125 into receptacle 126 on the carriage 128. Carriage 128 is pulled toward the front of the machine (−Y direction) by the articulators 107 and 111 to the cassette exchange position at the front of the machine. The user exchanges cassettes and acknowledges completion to the system through the user interface 101. The articulators 107 and 111 then push the carriage 128 back to its operational position. The carriage 128 releases the articulator drive actuator 125 from receptacle 126. Each of the articulators move to a position such that their substrate forks 106 and 110 are just in front of and below the lowest possible substrate in each cassette. Each articulator substrate fork then scans each of the two cassettes from bottom to top recording the presence of substrates.

Substrates are exchanged from the stage 116 in the following manner. If there are no substrates on the load fork 106 or in the prealign station 105, the load fork moves to just below the lowest substrate position in the load cassette. The load fork vacuum is turned on and the fork begins moving up until vacuum is sensed. The fork then moves the substrate toward the front of the machine until it is clear of the load cassette and carriage assembly. The fork then lowers the substrate to the prealign station elevation and then moves the substrate toward the rear of the machine and over the prealign vacuum chuck. The prealign chuck vacuum is turned on and the fork lowers the substrate until vacuum is sensed. The load articulator fork vacuum is then turned off. Prealign motor then rotates the substrate to locate and position the substrate for proper yaw orientation. Vacuum to load articulator fork is restored then load articulator is raised until vacuum is sensed at fork. Prealign vacuum is then released at prealign chuck and the substrate is drawn toward the front of the machine and out of prealign station.

If prealign, processing is complete and there is no substrate on the stage, the stage is moved to the load position. The reticle stage 602 is then locked to the platen and the reticle and substrate stages are disconnected. The substrate stage 608 is moved to its most forward (toward the front of the machine) and left position relative to the reticle stage 602. The substrate stage is then moved to the center of the opening in bottom of the reticle stage 602. The reticle and substrate stages are then reconnected by activating stage couplers 606 and the reticle stage 602 is released from the platen. The stage pop-up chuck 613 is raised and the stage pop-up chuck vacuum is turned on. The three focus actuators 603 are positioned to their lowest point. The stage then moves forward until the pop-up chuck is under the center of the substrate. The load articulator lowers the substrate until stage pop-up 613 vacuum is sensed and then removes vacuum from the load articulator fork 106. The stage 116 moves toward the rear of the machine to clear articulator fork 106. Stage substrate chuck vacuum is turned on and the stage pop-up chuck is lowered. After the stage substrate chuck 204 vacuum is sensed the pop-up chuck 613 vacuum is turned off. The substrate is leveled and focused by moving to a minimum of three positions programmed by the user. At each of these points, the substrate/lens gap distance is measured and the substrate vertical position is adjusted to obtain the requested air gap distance. The air gap at each point is evaluated until the gap distance is within an acceptable tolerance for performing the next process step.

The system then begins course alignment of the substrate 203 to the reticle 201. This initial fine alignment is performed as follows. A minimum of three points along the substrate edge are scanned over the air gauge sensor 205. At each point, the (X, Y) position where the gap distance dramatically changes (indicating the edge of the substrate) is recorded and the data is processed to calculate an X/Y/yaw offset. The reticle stage 602 is disconnected from the substrate stage 608. The substrate stage is moved by the required offset distance calculate above and the reticle stage is then reconnected to the substrate stage.

The system then proceeds to perform final leveling and focusing of the substrate. This activity is performed in a nearly identical way to the initial substrate leveling and focus process described above. The only exception being that all points are evaluated until the gap distance is within an acceptable tolerance specified by the user.

The system then begins fine alignment of the reticle to the substrate if the substrate has an existing image. Alignment is performed in the following manner. The stage 116 with the substrate 203 and reticle 201 is moved to the first of at least two positions so that the reticle key is aligned to the alignment system (see FIG. 5a) which is in the center of the optical field shown in FIG. 3c. This through-the-lens alignment system then quantifies the misalignment between the reticle and substrate. The substrate and reticle are then moved to the second alignment position where the process is repeated. After all positions have been evaluated, the reticle stage 602 is locked to the platen 114 and disconnected from the substrate stage 608. The substrate stage is moved by an amount determined from the misalignment data. The reticle and substrate stages are then reconnected and the reticle stage is released from the platen. If necessary, the entire process can be repeated until misalignment is reduced to a level acceptable to the user. If the system is unable to identify alignment geometries, a video display 101 of the alignment fiducial images is presented to the user for manual alignment.

With alignment complete (if necessary), the actual lithography process may begin. The lithography is performed as follows. The stage 116 (reticle stage 602 and substrate stage 608 are rigidly coupled together at this point) is moved to a position such that the illumination is blocked by the reticle stage in the right back corner. The illumination is turned on by opening the exposure shutter. The stage accelerates to a constant velocity (determined by user/process) in the −Y direction. When the printable area of the reticle passes through the illumination field, the image is relayed to the substrate through lens system 117. It is important to note here that the lens system preserves image position or that the image is said to be erect and non-inverted. Constant stage velocity is maintained until the printable area of the reticle is out of the illumination field. At the end of the scan, the stage de-accelerates to a stop, then indexes left (−X) by an amount determined by the illumination geometry. The stage repeats the previous process moving in −Y. The entire process above is repeated until the entire printable area of the reticle has been completely scanned (exposed). This process is done with the Sawyer type stepper motors to obviate the need for a metrology system on the stage because stepper motors can be commanded to an acceptably precise position without requiring a metrology system.

Figure 9A:
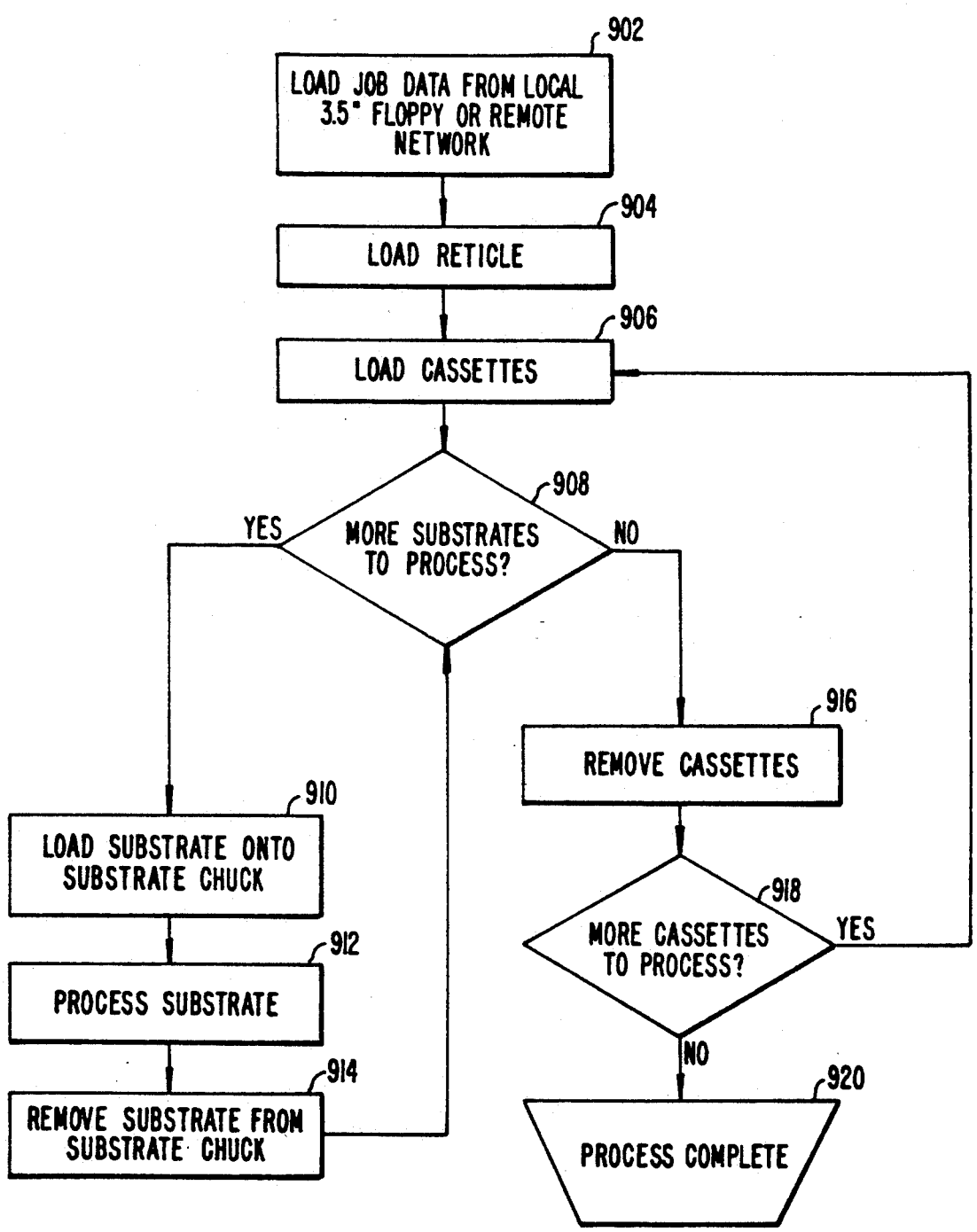
FIGS. 9a to 9g are flow charts illustrating operation of the system software.

FIGS. 9a to 9g illustrate operation of a computer program which may be used in operation of the system according to one embodiment of the invention. FIG. 9a provides an overall description of the system software. At step 902 job data are loaded from storage such as a 3.5" floppy disc, a network, or the like. At step 904 the reticle is loaded. At step 906 the substrate cassettes are loaded. At step 908 the system determines if there is another substrate to process. When there are substrates to process, at step 910 the system will load a substrate onto the substrate chuck. At step 912 the substrate will be processed and, then at step 914 the substrate will be removed from the chuck. The system then again checks to see if there are more substrates in the cassette to process.

When there are no additional cassettes to process, the system removes the cassette at step 916. At step 918 the system determines if there are more cassettes to process, and additional cassettes are processed beginning again at step 906. When there are no additional cassettes to process, the system terminates at step 920.

Figure 9B:
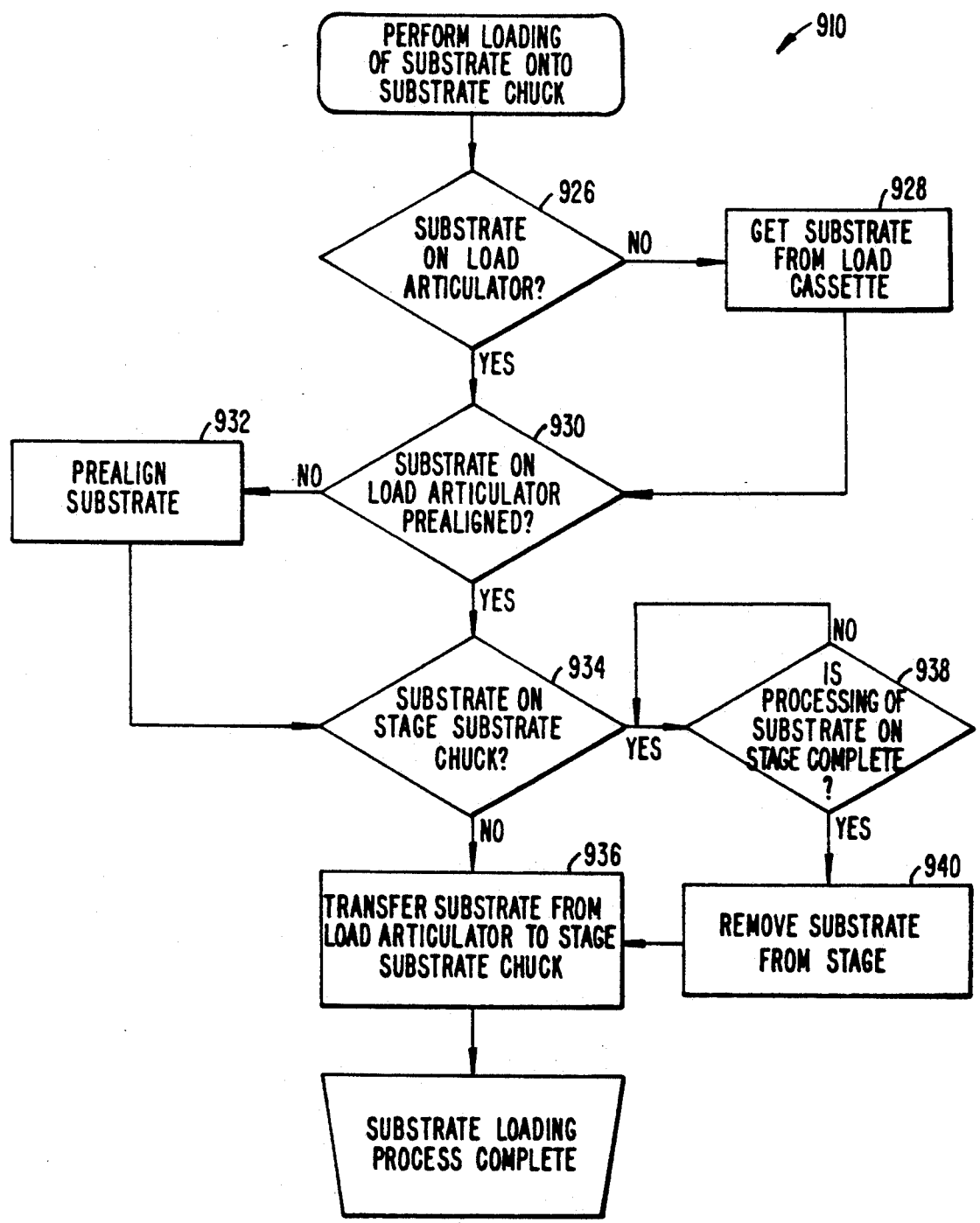

FIG. 9b illustrates the step 910 of performing loading of the substrate onto the substrate chuck in greater detail. At step 926 the system determines if there is a substrate on the load articulator. If not, a substrate is loaded from the cassette at step 928. At step 930, the system determines if the substate on the load articulator is prealigned and, if not, the substrate is aligned at step 932. At step 934, the system then determines if there is a substrate on the substrate chuck, and if not, transfers the substrate from the load articulator to the stage substrate chuck at step 936. If there is a substrate on the chuck, the system determines if processing of the substrate is complete, and when it is, removes the substrate from the stage, then proceeds to step 936. Substrate loading is then complete.

Figure 9C:
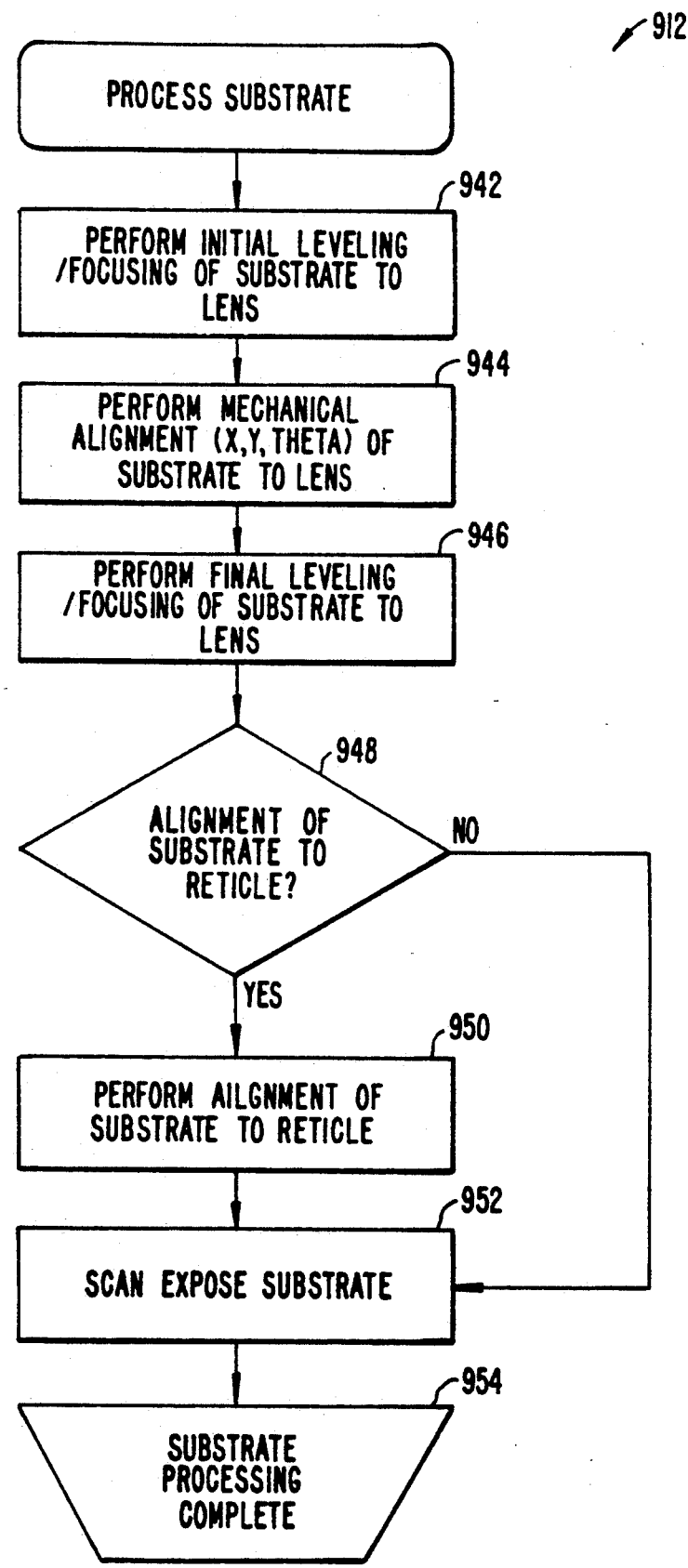

FIG. 9c illustrates the substrate processing step 912 in greater detail. At step 942 the system performs the initial leveling and focusing of the substrate to the lens. At step 944 the system performs mechanical alignment of the substrate to the lens. At step 946 final leveling and focusing of the substrate to the lens is performed. At step 948 the system determines if the substrate and reticle need to be aligned and, if so, the substrate and reticle are aligned at step 950. The system then exposes the substrate at step 952, completing the process at step 954.

Figure 9D:
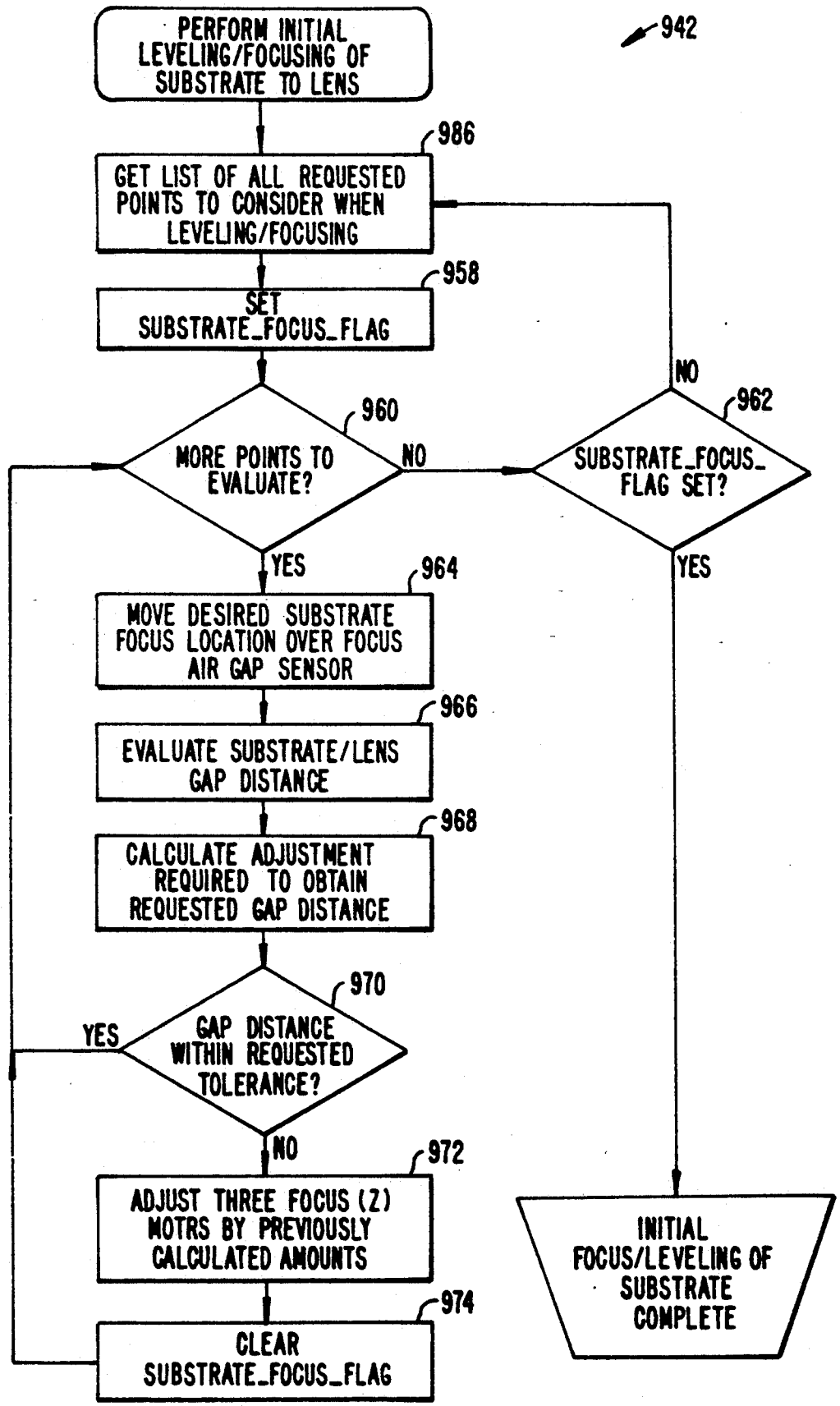

FIG. 9d illustrates the process of leveling and focusing of the substrate and lens as shown in step 942 in greater detail. At step 956 the system loads a list of all points to be considered when leveling and focusing. At step 958 a flag is set for focusing. At step 960 the system determines if more points are to be considered and, if so, at step 964 the system moves the desired substrate focus location over the focus air gap sensor. At step 966 the system evaluates the substrate/lens air gap and at step 968 determines the adjustment needed for the desired air gap. At step 970 the system determines if the gap is in tolerance ranges and, at step 972, if not, adjusts the three focus motors as needed. The substrate focus flag is then cleared, and the system returns to step 960 until all points have been corrected. Thereafter, at step 962, it is determined if the substrate focus flag has been set and, when it has (i.e., when a substrate has been adjusted) the system is completed.

Figure 9E:
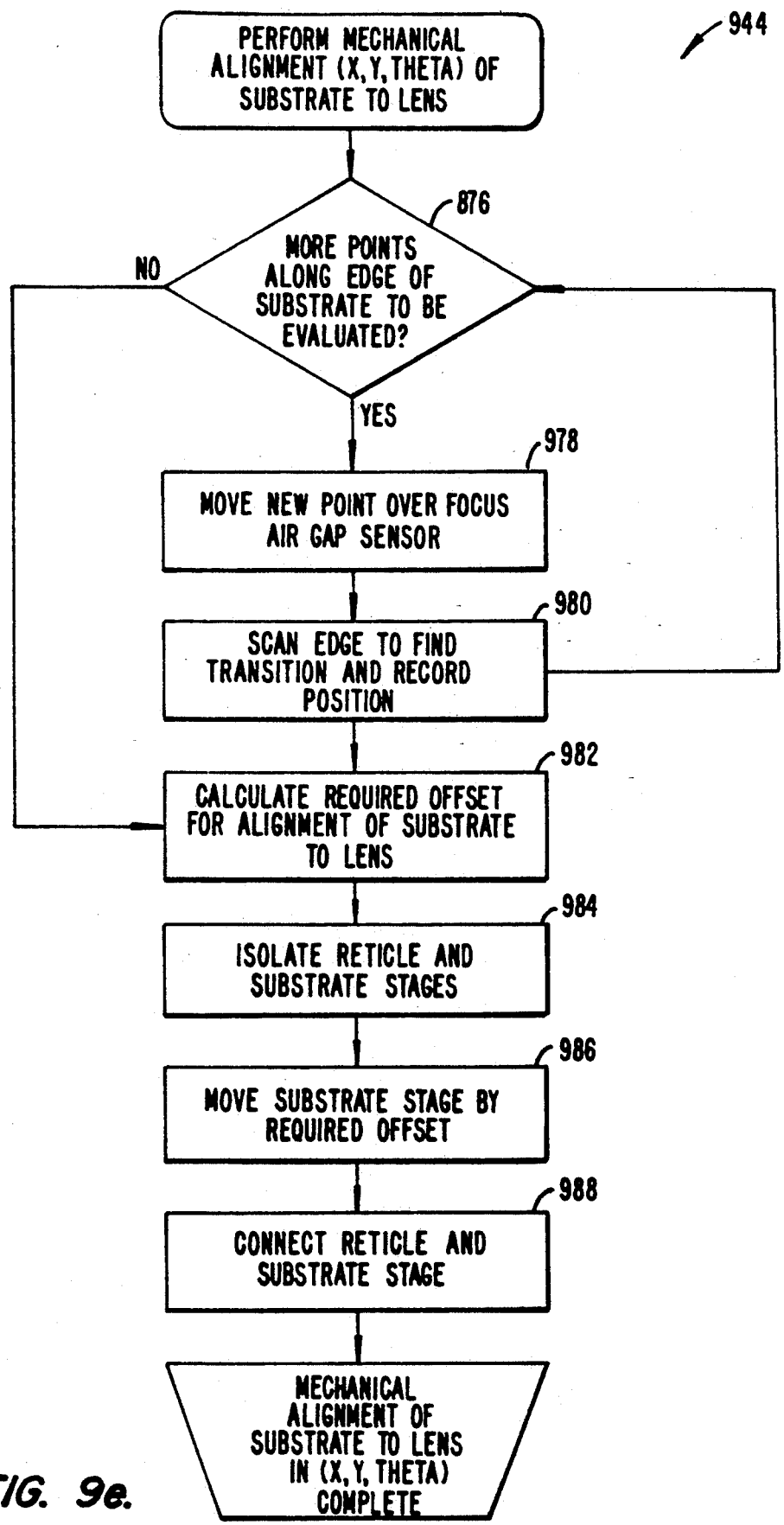

FIG. 9e illustrates the process for performing mechanical alignment of the substrate to the lens. At step 976 the system determines if more points along the substrate are to be evaluated. When there are, at step 978 the new point is moved over the focus air gap sensor, and at step 980 the edge is scanned to find transition and record position. The system then returns to step 976 until no additional points are to be evaluated.

Thereafter, at step 982 the system calculates the required offset for alignment of the substrate to the lens. At step 984 the system isolates the reticle and the substrate stages. At step 986 the substrate stage is moved by a necessary offset, and at step 988 the reticle and substrate stages are reconnected. The system is then completed.

Figures 9F, 9G:
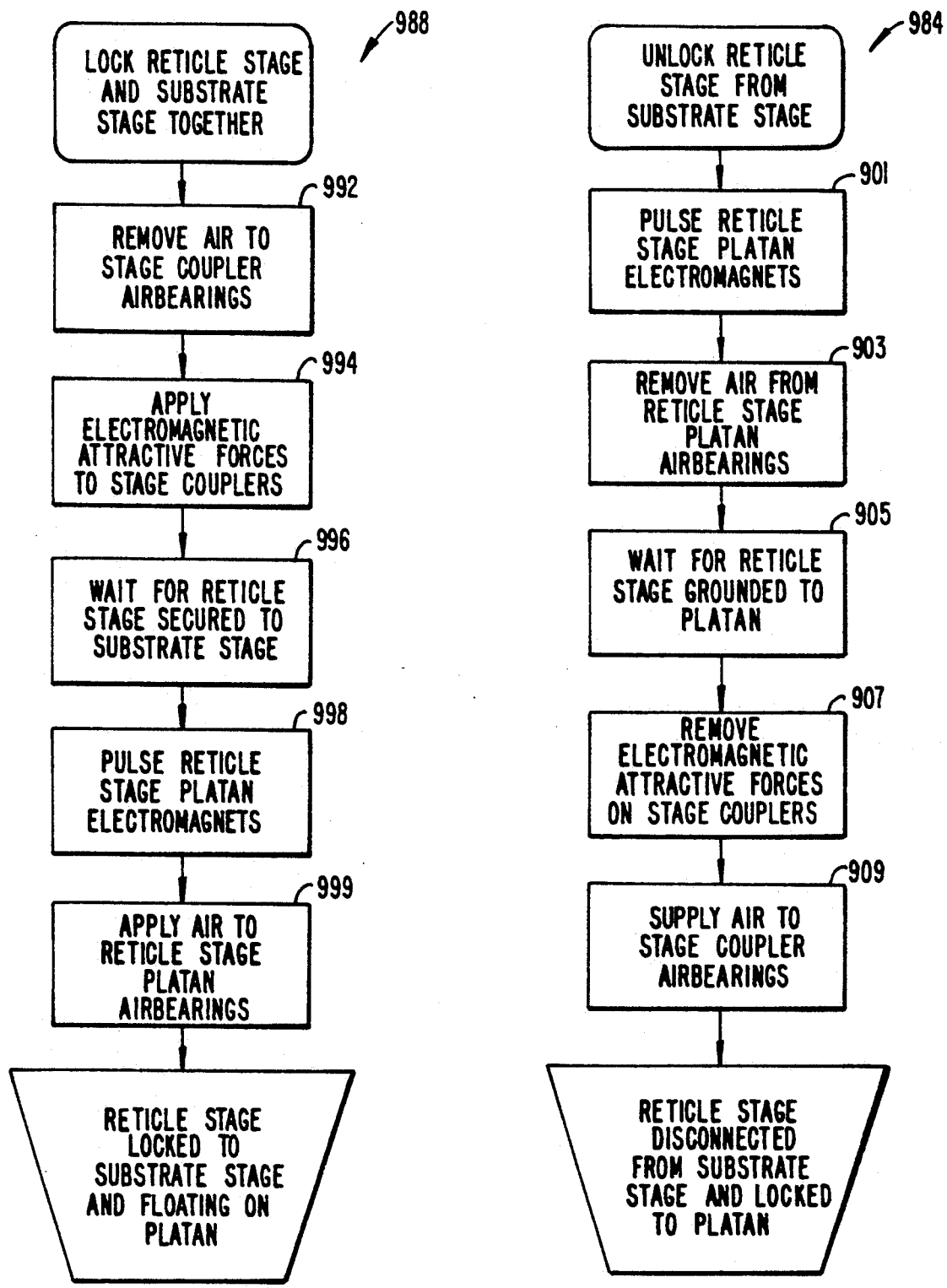

FIG. 9f illustrates the process for locking the reticle stage to the substrate stage at step 988 in greater detail. At step 992 the system stops the air flow to the stage coupler air bearings. At step 994 the system applies em forces to the stage couplers. At step 996 the system waits for a period to secure the reticle to substrate stages. At step 99 the system pulses the reticle stage platen electromagnets to ensure contact, and at step 999 applies air to the reticle stage platen air bearings. The process of securing the substrate is then complete.

FIG. 9g illustrates the process 984 of unlocking the reticle and the substrate stage in greater detail. At step 901 the system pulses the reticle stage electromagnets. At step 903 the system removes air from the reticle stage air bearings. At step 905 the system waits for the reticle stage to be grounded to the platen, and at step 907 the system removes the em attractive forces on the stage couplers. At step 909 the system supplies air to the stage coupler air bearings. The process of decoupling is then complete.

Figure 10A:
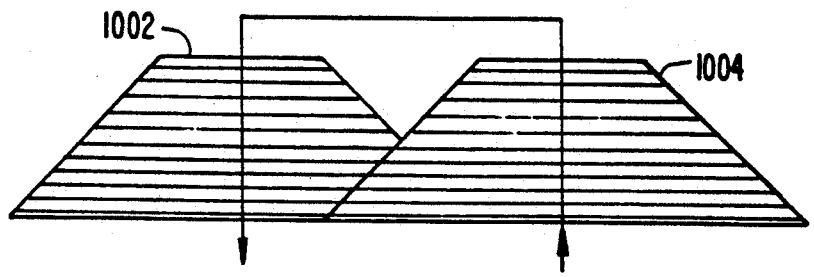
FIGS. 10a to 10c illustrate the scanning intensity of various scans of the system on the substrate.
Figure 10B:
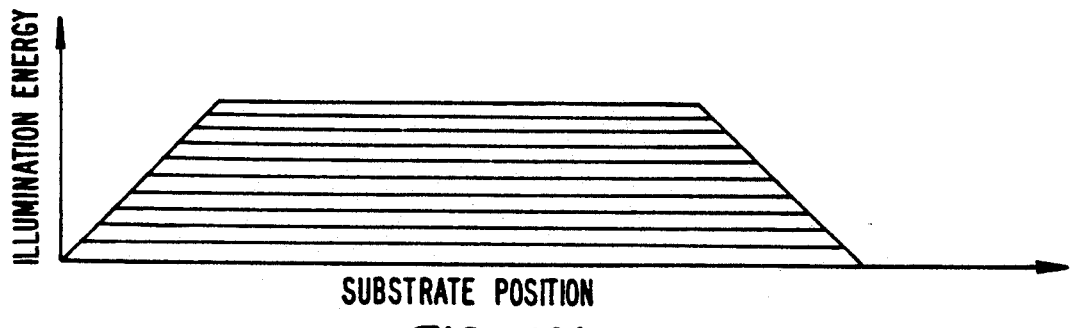
Figure 10C:
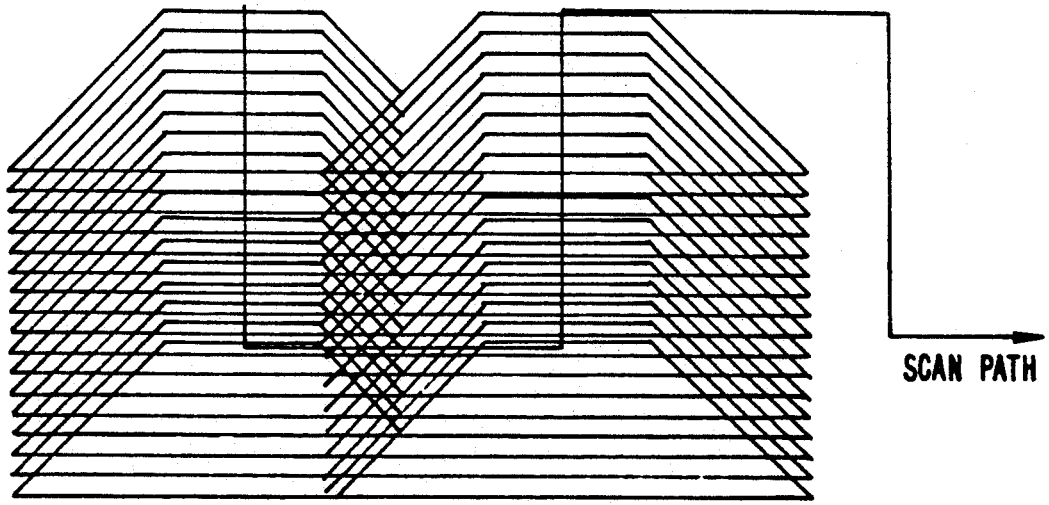

FIG. 10a shows how the trapezoidal (a one-dimensionally symmetric shape) illumination field is overlapped during two adjacent sequential scans 1002 and 1004 in the serpentine scanning process. The overlapping portions of adjacent scans adds to produce a substantially constant dose equivalent to the non-overlapped portion as seen in FIG. 10b. This process provides several benefits over existing lithography techniques. They are:

1. The ability to expose a large area with a small and less complex lens system.

2. Averaging of exposure across the Y axis, and X axis averaging for those portions of the field that are overlapping in X.

3. Averaging of field distortion (including printable defects) across the Y axis, and X axis averaging for those portions of the field that are overlapping in X.

4. Because of the X overlap during the scanning operation, no stage metrology is required during exposure.

5. The overlapping scan also eliminates the need for the stitching technique employed by lithography machines that attempt to create images larger than their field size.

A second mode of substrate exposure is possible with the system configuration described. In this second mode, the system can effectively step to any given location and align (if targeting was provided) and expose an area described by the trapezoidal field shape. This behavior is identical to that class of lithography equipment known as "Step and Repeat."

Illumination intensity is always held constant by monitoring light intensity in the illuminator 118 by sensor 331, and adjusting the lamp power supply 119. With the lithography process complete, the substrate will be moved into the unload cassette. The unload process is as follows. The stage moves to the unload position at the front left of the machine and the pop-up chuck 613 vacuum is turned on. The pop-up is raised until vacuum at the pop-up chuck is sensed. The stage substrate vacuum is released and the articulator fork 110 is lowered to an elevation just below substrate. The unload articulator fork vacuum is turned on. The stage moves toward the front of the machine until the substrate is centered on the unload articulator fork 110. The unload articulator fork then raises until vacuum is sensed. Vacuum is then released from the stage pop-up chuck. The stage moves toward the rear of the machine to clear the substrate. The unload articulator fork moves in the +Z direction to an elevation required to deposit the substrate into one of the unload cassette slots 103. The unload articulator then moves to the rear of the machine and thus moves the substrate into the appropriate unload cassette slot. Vacuum is removed from the unload articulator fork. The unload articulator fork moves down −Z, then toward the front of the machine to clear the unload cassette 103.

IX. Conclusion

The system has a wide variety of desirable features, and allows for the ready incorporation of additional features. For example, the system has a built-in, integrated user interface which can be configured for a remote file server. The architecture of the system enables construction of a system with a weight of less than 1000 lbs, preferably less than 700 lbs, and most preferably less than 500 lbs, all with a relatively small footprint. The above system provides a substantially improved lithography system and method.

The above description is illustrative and not restrictive. Many variations of the invention will become apparent to those of skill in the art upon review of this disclosure. Merely by way of example different materials of construction may be utilized, and the various optical operations may be performed by holograms or other optical elements. The scope of the invention should, therefore, be determined not with reference to the above description, but instead should be determined with reference to the appended claims along with their full scope of equivalents.

What is claimed is:

1. A photolithographic system comprising:
   an illumination section;
   a reticle mount adjacent the illumination section for holding a reticle comprising a pattern for fabrication of the electronic devices;
   a unity magnification optical relay system having at least two optical elements for forming an erect and non-reversed image for imaging the reticle onto a substrate, the reticle mount located between the illumination section and the optical relay system;
   a substrate mount for holding the substrate on the opposite side of the optical relay system relative to and substantially parallel to the reticle mount during the photolithographic process;
   means for substantially locking the reticle mount and the substrate mount together during the entire photolithographic process; and
   means for providing relative motion of the interlocked reticle and substrate mounts with respect to the optical relay and illumination systems in multiple, adjacent, partially overlapping scans.

2. A photolithographic system according to claim 1 wherein the plane of the reticle is oriented substantially vertically, parallel to the local gravity vector.

3. A photolithographic system according to claim 1 wherein the plane of the reticle is oriented substantially horizontally normal to the local gravity vector.

4. A photolithographic system according to claim 1 wherein the optical relay system is telecentric in object space and telecentric in image space.

5. A photolithographic system according to claim 1 wherein the interlocked reticle and substrate mounts are moved with respect to non-moving optical relay and illumination systems.

6. A photolithographic system according to claim 1 wherein the optical relay and illumination systems are moved with respect to non-moving, interlocked reticle and substrate mounts.

7. A photolithographic system according to claim 1 wherein the interlocked reticle and substrate mounts are incorporated into a stage means comprising a planar Sawyer type stepper motor drive means.

8. A photolithographic system according to claim 1 wherein the optical relay and illumination systems are each propelled by a planar Sawyer type stepper motor drive means.

9. A photolithographic system according to claim 1 further comprising an optical alignment system wherein the illumination of an alignment fiducial on the substrate is non-actinic and dark-field, and an optical alignment signal is passed from the substrate, through the optical relay system at the full numerical aperture of the optical relay system, and through the reticle.

10. A photolithographic system according to claim 1 wherein a stage upon which both the reticle and substrate are mounted is positioned about the optical relay system and adjacent the illumination section.

11. A photolithographic system according to claim 1 wherein storage for the substrate and reticle is located on a plane parallel to and above the plane of a stage, the stage being where the reticle and substrate are mounted.

12. A photolithographic system according to claim 1 further comprising articulator arms for exchanging substrates, the articulator arms being propelled by a planar Sawyer type stepper motor drive means.

13. A photolithographic system according to claim 1 wherein the reticle is substantially the same size as the substrate, and the optical relay system has an imaging field size which is smaller than the pattern on the reticle.

14. A photolithographic system according to claim 1 wherein a cross-section of an intensity distribution of the image formed by the unity magnification optical relay system normal to the direction of the scans is trapezoidal, and the scans overlap to an extent necessary to achieve a substantially uniform exposure of the substrate to the image.

15. A photolithographic system according to claim 1 wherein the unity magnification optical relay system comprises two telecentric unity magnification relay lenses.

16. A photolithographic system for manufacturing electronic devices comprising:
   an illumination section;
   a reticle mount adjacent said illumination section for holding a reticle in a substantially vertical orientation, comprising a pattern for fabrication of said electronic devices;
   a unity magnification imaging lens system for imaging said reticle onto a substrate, said reticle mount located between said illumination section and said imaging lens system, said imaging lens system comprising:
      a first optical relay comprising first and second prisms projecting trapezoidal images, said first prism receiving said pattern from said reticle and transmitting said pattern through a first series of lenses to a first mirror, and said second prism receiving said pattern from said first mirror through said first series of lenses; and
      a second optical relay comprising third and fourth prisms projecting trapezoidal images, said third prism receiving said pattern from said second prism and transmitting said pattern through a second series of lenses to a second mirror, and said fourth prism receiving said pattern from said second mirror through said second series of lenses and transmitting said pattern to said substrate, said prisms presenting an upright image on said substrate;
   means for holding said substrate in a substantially vertical, fixed position relative to said reticle mount during lithographic operations, said means for holding being located adjacent said unity magnification imaging lens system opposite said reticle mount, said means for holding being movable independently of said reticle mount; and
   means for moving said reticle mount and said means for holding said substrate together, relative to said lens and illumination systems.

* * * * *